(12) United States Patent
Kang et al.

(10) Patent No.: US 8,693,269 B2
(45) Date of Patent: Apr. 8, 2014

(54) MEMORY DEVICE FOR MANAGING TIMING PARAMETERS

(75) Inventors: Uk-song Kang, Seongnam-si (KR);
Chul-woo Park, Yongin-si (KR);
Hak-soo Yu, Seongnam-si (KR);
Hong-sun Hwang, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 50 days.

(21) Appl. No.: 13/569,636

(22) Filed: Aug. 8, 2012

(65) Prior Publication Data

US 2013/0039135 A1    Feb. 14, 2013

(30) Foreign Application Priority Data

Aug. 8, 2011  (KR) .................. 10-2011-0078745
Apr. 20, 2012 (KR) .................. 10-2012-0037553

(51) Int. Cl.
*G11C 7/00* (2006.01)
(52) U.S. Cl.
USPC ............ 365/189.16; 365/230.03; 365/230.06; 365/63; 365/233
(58) Field of Classification Search
USPC ............. 365/189.16, 230.03, 230.06, 233, 63
See application file for complete search history.

(56) References Cited

U.S. PATENT DOCUMENTS 6,064,621 A * 5/2000 Tanizaki et al. .......... 365/230.03
7,495,973 B2   2/2009 Jung et al.
2006/0039227 A1  2/2006 Lai et al.
2009/0052262 A1* 2/2009 Nii ........................... 365/189.14
2009/0196116 A1  8/2009 Oh

FOREIGN PATENT DOCUMENTS

| JP | 2010-113742 | 5/2010 |
| KR | 10-0297713 | 4/2000 |
| KR | 10-2005-0043269 A | 5/2005 |
| KR | 10-2007-0027616 A | 3/2007 |

OTHER PUBLICATIONS

Office Action dated Sep. 24, 2012, from the Korean Intellectual Property Office.

* cited by examiner

*Primary Examiner* — Connie Yoha
(74) *Attorney, Agent, or Firm* — Muir Patent Consulting, PLLC

(57) ABSTRACT

A method of performing write operations in a memory device including a plurality of bank is performed. Each bank includes two or more sub-banks including at least a first sub-bank and a second sub-bank. The method comprises: performing a first row cycle for writing to a first word line of the first sub-bank, the first row cycle including a plurality of first sub-periods, each sub-period for performing a particular action; and performing a second row cycle for writing to a first word line of the second sub-bank, the second row cycle including a plurality of second sub-periods of the same type as the plurality of first sub-periods. The first row cycle overlaps with the second row cycle, and a first type sub-period of the first sub-periods overlaps with a second type sub-period of the second sub-periods, the first type and second type being different types.

20 Claims, 14 Drawing Sheets

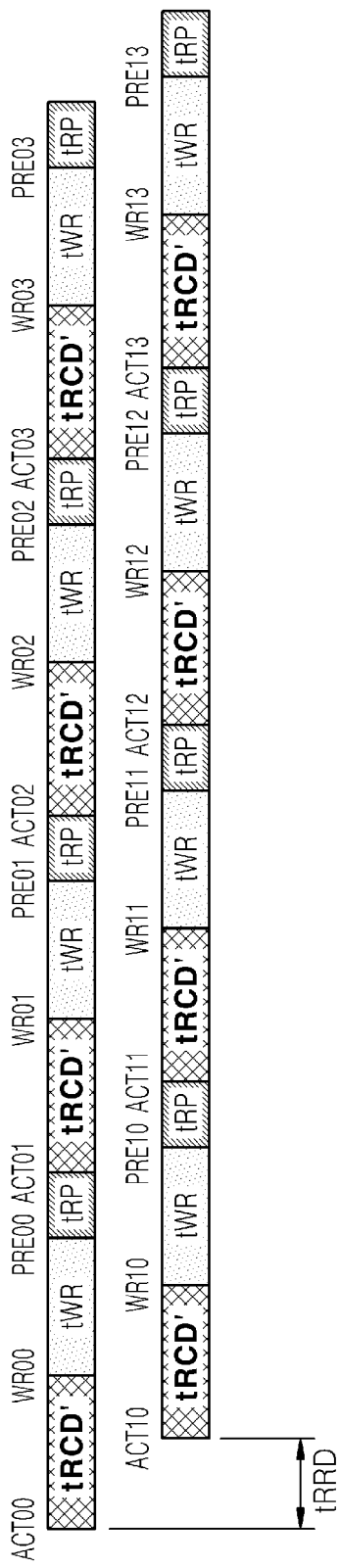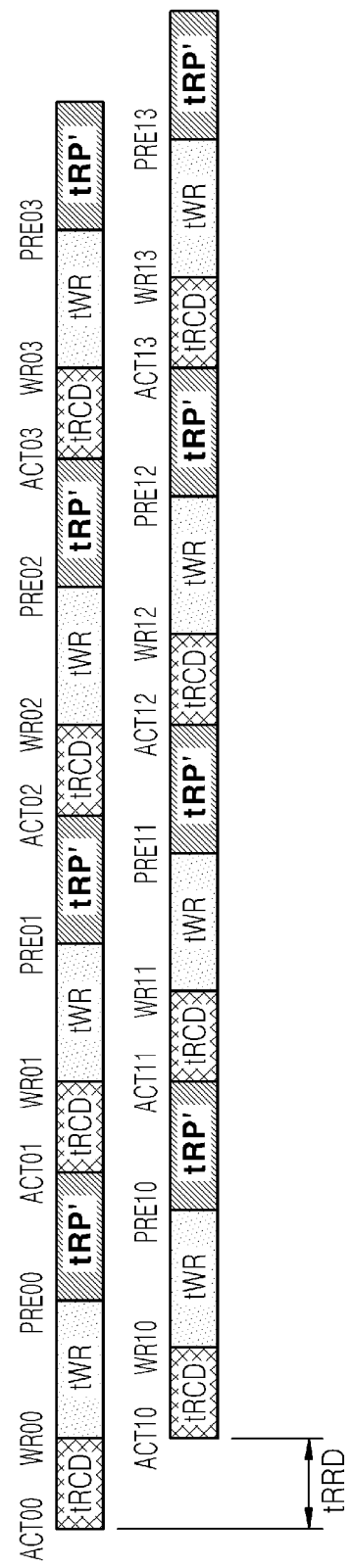

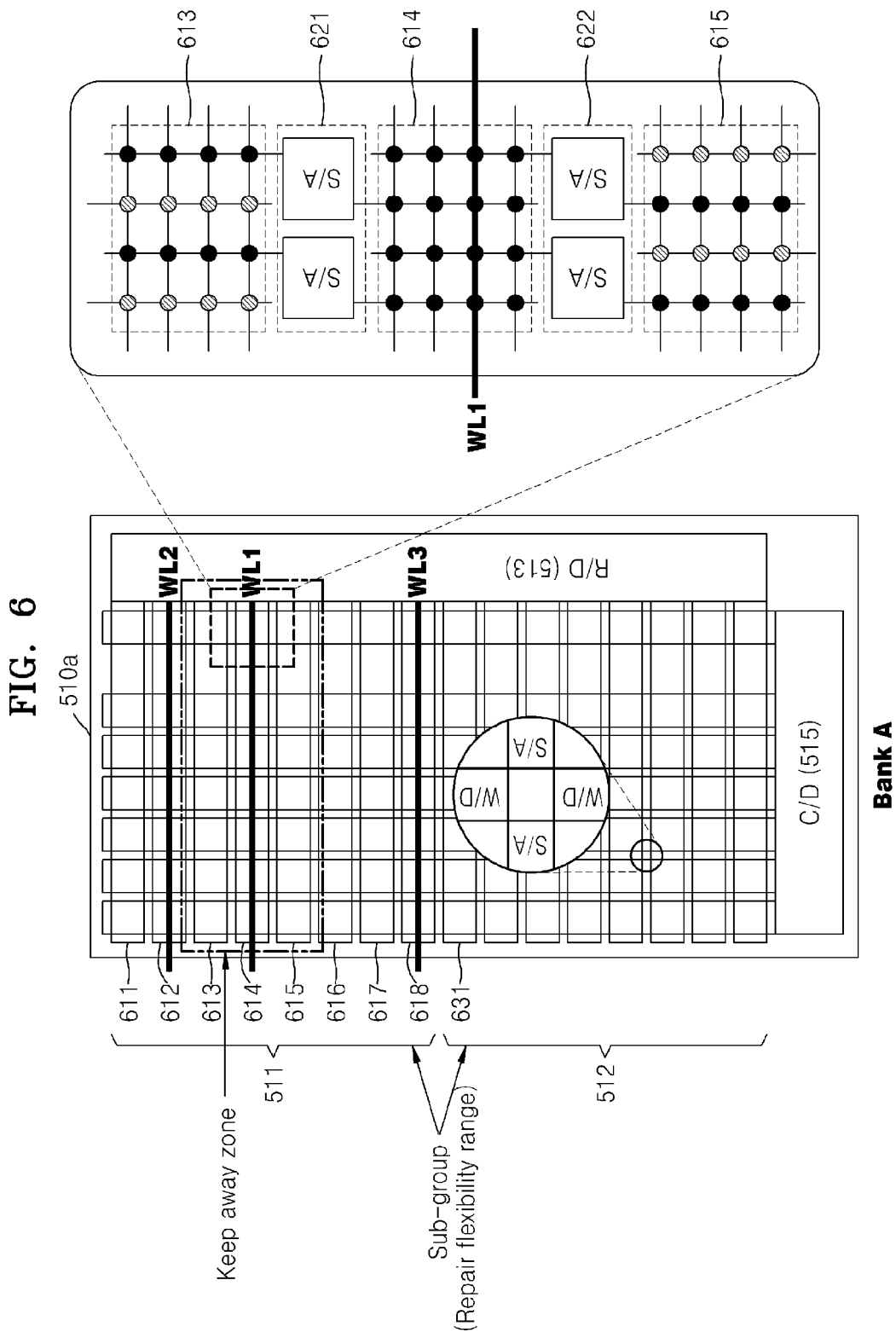

FIG. 7

| Sub-array A (current state) | Sub-array B (next state) | Comments |
|---|---|---|
| ACT | ACT | No timing constraint |
| ACT | PRE | No timing constraint |
| ACT | REF | No timing constraint |
| ACT | WR/RD | Invalid condition (2 wordlines cannot be on at the same time during RD or WR) |
| PRE | ACT | No timing constraint |
| PRE | PRE | No timing constraint |
| PRE | REF | No timing constraint |
| PRE | WR/RD | PRE2WR, PRE2RD timing constraint |
| REF | ACT | No timing constraint |
| REF | PRE | No timing constraint |
| REF | REF | No timing constraint |
| REF | WR/RD | PRE2WR, PRE2RD timing constraint |
| WR/RD | ACT | WR2ACT, RD2ACT timing constraint |
| WR/RD | PRE | Invalid condition (2 wordlines cannot be on at the same time during RD or WR) |
| WR/RD | WR/RD | Invalid condition (2 wordlines cannot be on at the same time during RD or WR) |
| WR/RD | REF | WR2REF, RD2REF timing constraint |

MEMORY DEVICE FOR MANAGING TIMING PARAMETERS

CROSS-REFERENCE TO RELATED APPLICATIONS

This application claims the benefit of Korean Patent Application No. 10-2011-0078745, filed on Aug. 8, 2011 and Korean Patent Application No. 10-2012-0037553, filed on Apr. 10, 2012, in the Korean Intellectual Property Office, the disclosure of each of which is incorporated herein in its entirety by reference.

BACKGROUND

The disclosed embodiments relate to a memory device, and more particularly, to a memory device for managing timing parameters from a memory controller.

A memory device operates according to specifications of timing parameters such as a memory cell data write time, a word line activation time, and a precharge time. Timing parameters increase as a semiconductor process shrinks, thereby reducing semiconductor yield. Accordingly, there is a demand for a method of managing timing parameters in a memory system.

SUMMARY

The present disclosure provides a memory device that may obtain a sufficient timing parameter margin by hiding timing parameters from a memory controller.

In one embodiment, a method of performing write operations in a memory device including a plurality of banks in which a plurality of memory cells are arranged, is performed. Each bank includes two or more sub-banks including at least a first sub-bank and a second sub-bank. The method comprising: performing a first row cycle for writing to a first word line of the first sub-bank, the first row cycle including a plurality of first sub-periods, each sub-period for performing a particular action; and performing a second row cycle for writing to a first word line of the second sub-bank, the second row cycle including a plurality of second sub-periods of the same type as the plurality of first sub-periods. The first row cycle overlaps with the second row cycle, and a first type sub-period of the first sub-periods overlaps with a second type sub-period of the second sub-periods, the first type and second type being different types.

In one embodiment, the first type sub-period of the first sub-periods also overlaps with a first type sub-period of the second sub-periods, the first types being the same type. The first type sub-period may be a data write operation time period, and the second type sub-period may be a word line enable time period or a precharge time period. Alternatively, the first type sub-period may be a word line enable time period, and the second type sub-period may be a precharge time period. In another embodiment, the first type sub-period is a precharge time period, and the second type sub-period is a word line enable time period.

In one embodiment, the first type sub-period is a word line enable time period, and the second type sub-period is a precharge time period.

In one embodiment, a row cycle start time for the first row cycle is a different time from a row cycle start time for the second row cycle. A row cycle end time for the first row cycle is a different time from a row cycle end time for the second row cycle, and the time between the row cycle start time and row cycle end time for the first row cycle is the same as the time between the row cycle start time and row cycle end time for the second row cycle.

Also, a difference between the row cycle start time for the first row cycle and the row cycle start time for the second row cycle is between 5% and 25% of the difference between the row cycle start time for the first row cycle and the row cycle end time for the first row cycle.

The method may additionally include a plurality of additional row cycles for writing to the first sub-bank and a plurality of additional row cycles for writing to the second sub-bank, wherein starts of the row cycles between the first sub-bank and second sub-bank are staggered.

In one embodiment, a method of performing write operations in a memory device including a plurality of banks in which a plurality of memory cells are arranged is performed. Each bank includes two or more sub-banks including at least a first sub-bank and a second sub-bank. The method includes performing a first cycle for a first word line of a first sub-bank of a memory bank for writing to the first word line of the first sub-bank, the first cycle including a word line enable time period, a data write operation time period, and a precharge time period; and performing a second cycle for a first word line of a second sub-bank of the memory bank for writing to the first word line of the second sub-bank, the second cycle including a word line enable time period, a data write operation time period, and a precharge time period. The first cycle overlaps with the second cycle, and the data write operation time period of the first cycle overlaps with at least one of the word line enable time period and the precharge time period of the second cycle.

In one embodiment, the data write operation time period of the first cycle also overlaps with the data write operation time period of the second cycle. The word line enable time period of the first cycle may overlap with the precharge time period of the second cycle. The precharge time period of the first cycle may overlaps with the precharge time period of the second cycle. The word line enable time period of the first cycle may overlap with the word line enable time period of the second cycle.

In another embodiment, a controller is disclosed for controlling write operations in a memory device including a plurality of banks in which a plurality of memory cells are arranged, each bank including two or more sub-banks including at least a first sub-bank and a second sub-bank. The controller is configured to implement a method. The method includes performing a first row cycle for writing to a first word line of the first sub-bank, the first row cycle including a plurality of first sub-periods, each sub-period for performing a particular action; and performing a second row cycle for writing to a first word line of the second sub-bank, the second row cycle including a plurality of second sub-periods of the same type as the plurality of first sub-periods. The first row cycle overlaps with the second row cycle, and a first type sub-period of the first sub-periods overlaps with a second type sub-period of the second sub-periods, the first type and second type being different types.

In one embodiment, the first type sub-period of the first sub-periods also overlaps with a first type sub-period of the second sub-periods, the first types being the same type.

In one embodiment the first type sub-period is a data write operation time period, and the second type sub-period is a word line enable time period or a precharge time period.

In one embodiment, a row cycle start time for the first row cycle is a different time from a row cycle start time for the second row cycle. A row cycle end time for the first row cycle may be a different time from a row cycle end time for the second row cycle, and the time between the row cycle start time and row cycle end time for the first row cycle may be the same as the time between the row cycle start time and row cycle end time for the second row cycle.

BRIEF DESCRIPTION OF THE DRAWINGS

Exemplary embodiments will be more clearly understood from the following detailed description taken in conjunction with the accompanying drawings in which:

FIGS. 3A through 3D are diagrams for explaining an operation of the memory device of FIG. 1, according to certain exemplary embodiments;

FIG. 6 is a diagram for explaining an architecture of a first bank of FIG. 5, according to certain exemplary embodiments.

FIG. 7 is a diagram for explaining timing constraints in continuous commands of different sub-arrays in FIG. 6, according to certain exemplary embodiments;

DETAILED DESCRIPTION

Figure 1:
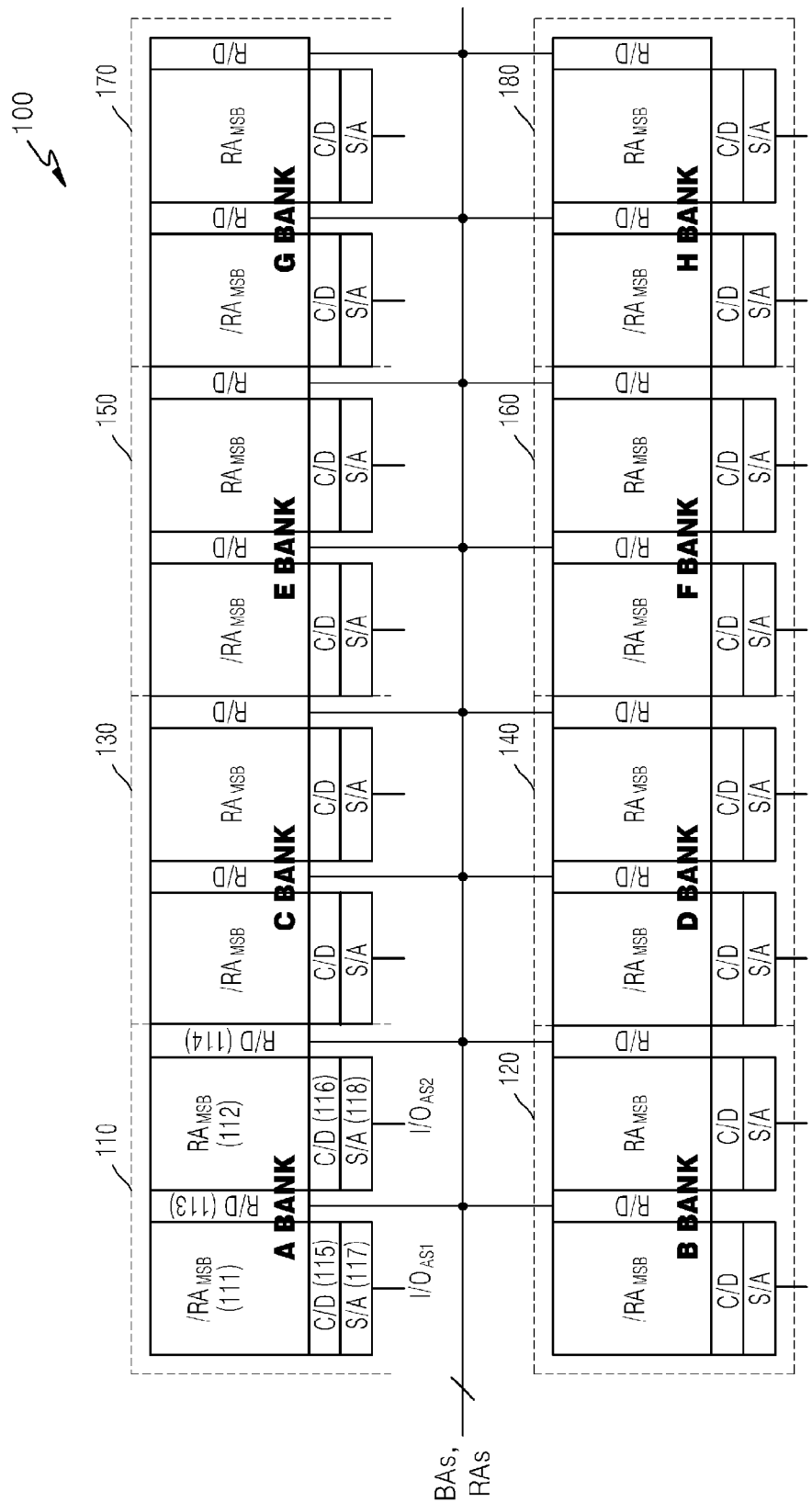
FIG. 1 is a block diagram illustrating a memory device which may use a method of managing one or more hidden timing parameters, according to one exemplary embodiment.

As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which exemplary embodiments are shown. While exemplary embodiments are susceptible to various modifications and alternative forms, specific embodiments thereof are shown by way of example in the drawings and will herein be described in detail. It should be understood, however, that there is no intent to limit exemplary embodiments to the particular forms disclosed, but conversely, exemplary embodiments are to cover all modifications, equivalents, and alternatives falling within the spirit and scope of the inventive concept. In the drawings, similar reference numerals denote similar components. Sizes of structures in the drawings may be exaggerated or diminished for clarity.

The terminology used herein is for the purpose of describing particular embodiments only and is not intended to be limiting of exemplary embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless defined otherwise, all terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first bank or sub-bank could be termed a second bank or sub-bank, and, similarly, a second bank or sub-bank could be termed a first bank or sub-bank without departing from the teachings of the disclosure.

In a semiconductor memory device, examples of timing parameters include a row cycle time tRC, a /RAS-to-/CAS time tRCD, a write recovery time tWR, a row precharge time tRP, and a row active-to-row active time tRRD.

The row cycle time tRC represents a time between an active command and a next active command. The /RAS-to-/CAS time tRCD represents a time between the applying of a /RAS signal and the applying of a /CAS signal, for example, a time between a row active command and a column active command. The tRCD therefore represents a number of clock cycles between the activating of a row of memory and accessing columns within it. As described further below, the tRCD corresponds to a first period of a cycle, also referred to herein as a word line enable time period. The write recovery time tWR represents a time between the enabling of a word line and the writing of data to a memory cell. As described further below, the write recovery time tWR corresponds to a second period of a cycle, also referred to herein as a data write operation time period. The row precharge time tRP represents a time between the write recovery time tWR and the precharging of a bit line in order to prepare a next active command. As described further below, the precharge time tRP corresponds to a third period of a cycle, also referred to herein as a precharge time period. The row active-to-row active time tRRD represents a time between a row active command and a row active command, such as, for example, a row active-to-row active time between different sub-banks. Additional description of these different time periods are described in U.S. Pat. No. 7,495,973, which is incorporated by reference herein in its entirety.

As the write recovery time tWR increases, a data write time to a memory cell may increase. Accordingly, the semiconductor memory device may obtain a sufficient time margin needed to write data.

As a semiconductor process shrinks, timing parameters increase, thereby reducing semiconductor yield. From among the timing parameters, the write recovery time tWR is an important factor in reducing semiconductor yield.

If the write recovery time tWR, which increases as a semiconductor process shrinks, is not used in determining timing parameters in a semiconductor device, a semiconductor process may be simplified and yield may be improved. Accordingly, manufacturing costs of the semiconductor memory device may be reduced. A memory system may include a highly integrated, low-cost memory device even when the memory system reaches a scaling limit.

FIG. 1 is a block diagram illustrating a memory device 100 which may use a method of managing one or more timing parameters, according to one embodiment.

Figure 2:
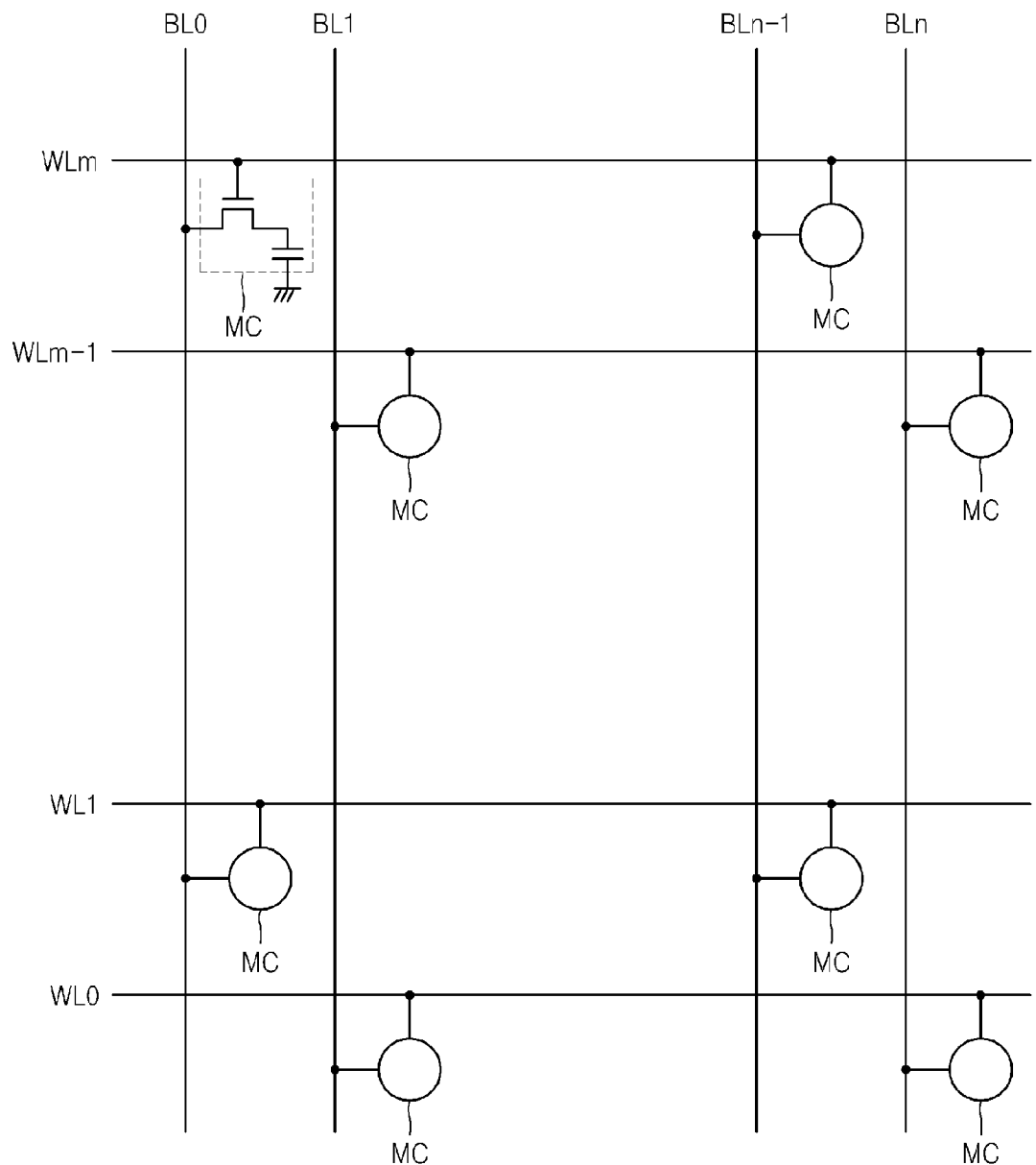
FIG. 2 is a circuit diagram illustrating one of banks of the memory device of FIG. 1, according to one exemplary embodiment.

Referring to FIG. 1, the memory device 100 includes a plurality of banks, such as an A bank through an H bank 110 through 180 in which a plurality of memory cells are arranged in columns and rows. Each of the plurality of banks 110 through 180 includes a plurality of word lines WLs, a plurality of bit lines BLs, and a plurality of memory cells MCs disposed near intersections between the word lines WLs and the bit lines BLs, as shown in FIG. 2. In one embodiment, each of the memory cells MCs includes a dynamic random access memory (DRAM) cell structure. The word lines WLs to which the memory cells MCs are connected may be defined as rows of the banks 110 through 180, and the bit lines BLs to which the memory cells MCs are connected may be defined as columns of each of the banks 110 through 180.

The memory device 100 includes 8 banks, for example, the A bank through the H bank 110 through 180 in FIG. 1. However, the present disclosure is not limited thereto, and the number of banks included in the memory device 100 may be different from 8.

Each of the plurality of banks 110 through 180 may include a first sub-bank 111, a second sub-bank 112, a first row decoder 113, a second row decoder 114, a first column decoder 115, and a second column decoder 116. The first row decoder 113 and the second row decoder 114 may receive bank address signals BAs and row address signals RAs. The first column decoder 115 and the second column decoder 116 may receive column address signals (not shown). One of the plurality of banks 110 through 180 may be selected according to the bank address signals BAs, and memory cells in the selected bank may be addressed according to the row address signals RAs and the column address signals.

The A bank 110 may be divided into the first sub-bank 111 and the second sub-bank 112. In one embodiment, the first sub-bank 111 and the second sub-bank 112 are arranged in a direction, for example, a row direction, in which the word lines WLs of the memory cells MCs are arranged. The first sub-bank 111 may be connected to the first row decoder 113 and the first column decoder 115. Memory cells of the first sub-bank 111 may be addressed by the first row decoder 113 and the first column decoder 115. The second sub-bank 112 may be connected to the second row decoder 114 and the second column decoder 116. Memory cells of the second sub-bank 112 may be addressed by the second row decoder 114 and the second column decoder 116.

The first sub-bank 111 or the second sub-bank 112 may be selected by any one bit from among the row address signals RAs applied to the first row decoder 113 and the second row decoder 114. For example, the first sub-bank 111 or the second sub-bank 112 may be selected by a most significant bit (MSB) signal $RA_{MSB}$ of the row address signals RAs. The first sub-bank 111 may be selected by a /$RA_{MSB}$ signal, and the second sub-bank 112 may be selected by a $RA_{MSB}$ signal.

In one embodiment, the first sub-bank 111 and the second sub-bank 112 are respectively connected to first and second data line sense amplifier blocks 117 and 118 and also respectively connected to first and second data input/output lines $I/O_{AS1}$ and $I/O_{AS2}$ which are independent from each other. Data read from the first sub-bank 111 may be output through the first data line sense amplifier block 117 and the first data input/output lines $I/O_{AS1}$. Data read from the second sub-bank 112 may be output through the second data line sense amplifier 118 and the second data input/output lines $I/O_{AS2}$.

Like the A bank 110, each of the B bank through the H bank 120 through 180 may be divided into a first sub-bank and a second sub-bank. The first sub-bank of each bank may be connected to a first row decoder, a first column decoder, a first data line sense amplifier block, and first data input/output lines. The second sub-bank of each bank may be connected to a second row decoder, a second column decoder, a second data line sense amplifier block, and second data input/output lines. Although each of the A bank through the H bank 110 through 180 includes two sub-banks in FIG. 1, the present embodiment is not limited thereto, and the number of sub-banks included in each of the banks may be different from 2. The sub-banks may be connected to data line sense amplifier blocks and data input/output lines which are independent from each other.

Figure 3A:
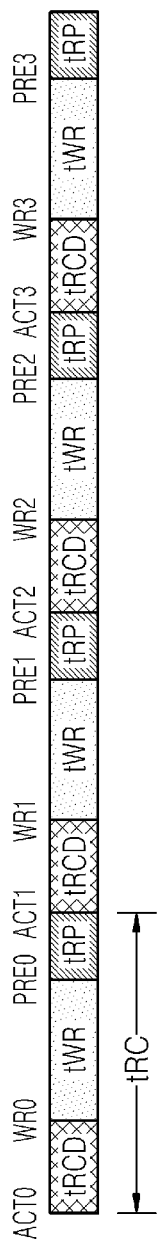
Figure 3B:
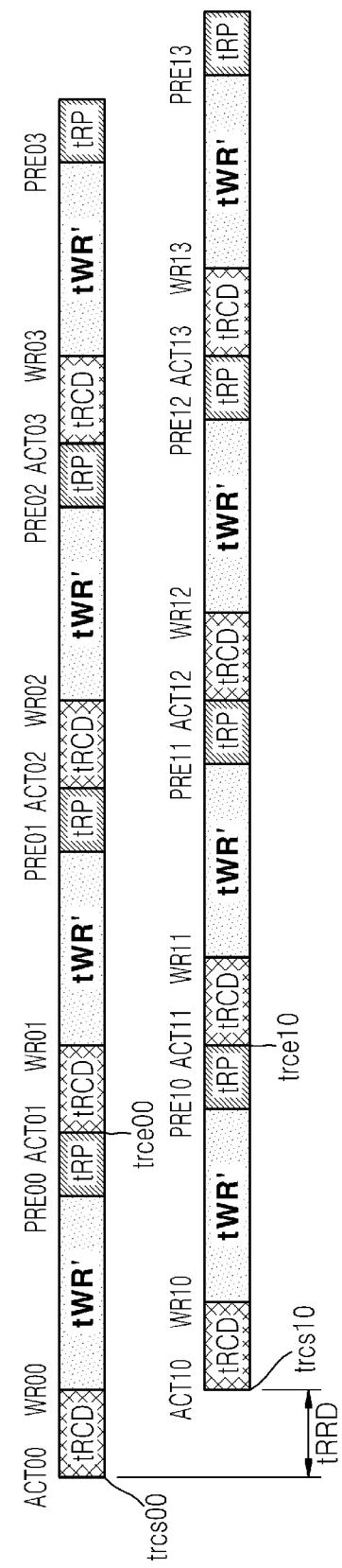

FIGS. 3A through 3D are diagrams for explaining an exemplary operation of the memory device 100 of FIG. 1. FIG. 3A is a diagram for explaining a bank interleaving method. FIGS. 3B through 3D are diagrams for explaining a sub-bank interleaving method.

Referring to FIG. 3A, in the bank interleaving method, the A bank through the H bank 110 through 180 operate in an interleaved manner, that is, continuously, one bank-by-one bank. The bank interleaving method may include an operation of, for example, the A bank 110 and an operation of any one bank from among the banks 120 through 180 other than the A bank 110. For example, operations on the different banks may alternate, so that a row cycle of the first bank occurs, then a row cycle of the second bank occurs, and then the alternating pattern repeats. Alternatively, the bank interleaving method may include an operation of the A bank 110 and an operation of the A bank 110. The bank interleaving method of FIG. 3A will be explained with reference to a continuous operation of the A bank 110.

A first active command ACT0 for the A bank 110 is applied, a /RAS-to-/CAS time tRCD elapses, and a first word line WL0 is enabled. The first word line WL0 is connected to selected memory cells in the A bank 110. A data write operation to the selected memory cells connected to the first word line WL0 is performed. A memory cell data write operation of the A bank 110 is performed for a write recovery time tWR. After the write recovery time tWR elapses, bit lines of the memory cells in the A bank 110 are precharged due to a first precharge command PRE0. A bit line precharge operation of the A bank 110 is performed for a row precharge time tRP. A first write operation of the A bank 110 is performed for tRCD+tWR+tRP in total.

Next, a second active command ACT1 for the A bank 110 is applied, a /RAS-to-/CAS time tRCD elapses, and a second word line WL1 is enabled. The second word line WL1 is connected to selected memory cells in the A bank 110. A data write operation to the selected memory cells connected to the second word line WL1 is performed. A memory cell data write operation of the A bank 110 is performed for a write recovery time tWR. After the write recovery time tWR elapses, bit lines of the memory cells in the A bank 110 are precharged due to a second precharge command PRE1. A bit line precharge operation of the A bank 110 is performed for a row precharge time tRP. A second write operation of the A bank 110 is performed for tRCD+tWR+tRP in total. Additional write operations may then be performed for additional word lines WL2, WL3, etc.

In the bank interleaving method, the first write operation and the second write operation of the A bank 110 are performed at a tRC interval that corresponds to tRCD+tWR+tRP. A row cycle time tRC may be, for example, about 50 ns or more.

Referring to FIG. 3B, in the sub-bank interleaving method, the first and second sub-banks 111 and 112 in each of the banks 110 through 180 operate in an interleaved manner, for example, continuously, with overlapping but out of phase cycles. The sub-bank interleaving method will be explained with reference to, for example, operations of the first and second sub-banks 111 and 112 of the A bank 110. It is assumed that first set of active commands ACT00, ACT01, ACT02, and ACT03 are active commands for the first sub-bank 111 (e.g., each for a different word line) and second set of active commands ACT10, ACT11, ACT12, and ACT13 are active commands for the second sub-bank 112 (e.g., each for a different word line).

The first active command ACT00 of the first set of active commands for the first sub-bank 111 is applied, a /RAS-to-/CAS time tRCD elapses, and a first word line WL0 of the first sub-bank 111 is enabled. The first word line WL0 is connected to selected memory cells in the first sub-bank 111. A data write operation is performed on the selected memory cells connected to the first word line WL0. A memory cell data write operation of the first sub-bank 111 is performed for a memory cell data write time tWR'. After the memory cell data write time tWR' elapses, bit lines of the memory cells in the first sub-bank 111 are precharged due to a first precharge command PRE0. A bit line precharge operation of the first sub-bank 111 is performed for a row precharge time tRP. Next, a second active command ACT01 of the first set of active commands for the first sub-bank 111 may be applied, the second word line WL1 of the first sub-bank 111 may be enabled, a memory cell data write operation may be performed, and a bit line precharge operation may be performed, etc. This process may be repeated for a number of cycles for writing to additional word lines of the first sub-bank 111. Each cycle for writing to a word line may be referred to herein as a row cycle, having a row cycle start time (trcs) and a row cycle end time (trce).

The first active command ACT10 of the second set of active commands for the second sub-bank 112 is applied, a /RAS-to-/CAS time tRCD elapses, and a first word line WL0 of the second sub-bank 112 is enabled. The first word line WL0 is connected to selected memory cells in the second sub-bank 112. A data write operation is performed on the selected memory cells connected to the first word line WL0. A memory cell data write operation of the second sub-bank 112 is performed for a memory cell data write time tWR'. After the memory cell data write time tWR' elapses, bit lines of the memory cells in the second sub-bank 112 are precharged due to a second precharge command PRE10. A bit line precharge operation of the second sub-bank 112 is performed for a row precharge time tRP. Next, a second active command ACT11 of the second set of active commands for the second sub-bank 112 may be applied, a second word line WL1 of the second sub-bank 112 may be enabled, a memory cell data write operation may be performed, and a bit line precharge operation may be performed, etc. This process may be repeated for a number of cycles for writing to additional word lines of the second sub-bank 112.

In the sub-bank interleaving method, the first active command ACT00 for the first sub-bank 111 and the first active command ACT10 for the second sub-bank 112 may be applied at a tRRD interval, which corresponds to a row active-to-row active time between different sub-banks. For example, the row cycle start times trcs for data write operations to different rows in different sub-ranks 111 and 112 of A bank 110 may be staggered. The row cycle start times trcs may alternate between the sub-banks. Similarly, the row cycle end times trce for data write operations to different rows in different sub-ranks 111 and 112 of A bank 110 may be staggered. The row cycle start times trce may alternate between the sub-banks A row active-to-row active time tRRD may be, for example, about 6 ns or more.

As described above and as shown for example in FIG. 3B, write operations for two word lines in different sub-banks of a bank may occur simultaneously, but the start and end times may be staggered. In addition, sub-periods within one sub-bank (e.g., tRCD, tWR, and tRP) may overlap different sub-periods of another sub-bank (e.g., tRCD, tWR, and tRP). Certain sub-periods in a first sub-bank may overlap a different type of sub-period in a second sub-bank, but may also overlap a same type of sub-period in the second sub-bank. For example, as shown in FIG. 3B, the tWR' sub-period in the first bank overlaps both a tRCD period in the second bank and a tWR' period in the second bank. Other examples of sub-periods, including start times and end times for different sub-periods and relative lengths of sub-periods are shown in FIGS. 3B-3D.

Since, in the bank interleaving method, two word lines may not be enabled in one bank, for example, the A bank 110, a continuous data write operation of the A bank 110 may be performed at a tRC interval. However, in the sub-bank interleaving method, a data write operation with respect to the first and second sub-banks 111 and 112 in the A bank 110 may be performed at a tRRD interval. The row active-to-row active time tRRD may be much shorter than the row cycle time tRC. For example, in certain embodiments, the tRRD may be between 5% and 25% of the cycle times tRC for each sub-bank. Accordingly, in the sub-bank interleaving method, since a continuous data write operation is performed at a tRRD interval, a memory cell data write time tWR' in each data write operation may increase.

In the sub-bank interleaving method, as the memory cell data write time tWR' increases, a sufficient time needed to write data may be obtained. A write recovery time tWR, which increases as a semiconductor process shrinks, may be compensated for.

Also, the memory cell data write time tWR' is not included in a time interval of a continuous data write operation of sub-banks. In the memory cell data write time tWR', a host, for example, a memory controller, does not need to observe a specification of the memory cell data write time tWR' as a specification of a timing parameter at a continuous data write operation timing of sub-banks. For example, in the sub-bank interleaving method, the memory cell data write time tWR' may be hidden from the memory controller (e.g., unknown to the memory controller). The hidden memory cell data write time tWR' does not affect a data processing time and an amount of data to be processed.

In the present embodiment, in the sub-bank interleaving method, a sufficient amount of memory cell data write time tWR' is obtained. In the sub-bank interleaving method, a sufficient amount of /RAS-to-/CAS time tRCD or row precharge time tRP instead of a memory cell data write time tWR' may be obtained.

FIG. 3C illustrates a case where a /RAS-to-/CAS time tRCD' increases and FIG. 3D illustrates a case where a bit line precharge time tRP' increases, in a continuous data write operation of sub-banks. The /RAS-to-/CAS time tRCD' and the bit line precharge time tRP' are not included in a time interval of a continuous data write operation of sub-banks. The /RAS-to-/CAS time tRCD' and the /RAS-to-/CAS time tRP' may be hidden from a memory controller at a continuous data write operation timing of sub-banks. The hidden /RAS-to-/CAS time tRCD' or bit line precharge time tRP' does not affect a data processing time and an amount of data to be processed.

Although not shown, the examples of FIGS. 3B-3D may also apply to a method for writing consecutively to a same word line of different banks having different sub-banks. For example, a tRCD, tWR, and tRP may be applied to a first word line of a first sub-bank of a first bank; next after tRRD, a tRCD, tWR, and tRP may be applied to a first word line of a second sub-bank of the first bank; next a tRCD, tWR, and tRP may be applied to a first word line of a first sub-bank of a second bank after the tRCD, tWR, and tRP have completed for the first word line of the first sub-bank of the first bank; next after tRRD, and after the tRCD, tWR, and tRP have completed for the first word line of the second sub-bank of the first bank, a tRCD, tWR, and tRP may be applied to a first word line of a second sub-bank of the second bank. This procedure may repeat for additional banks.

Figure 4:
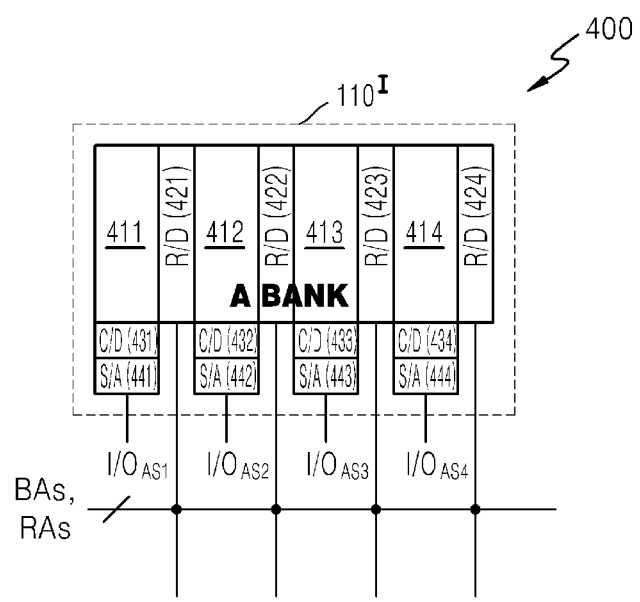
FIG. 4 is a block diagram illustrating a memory device which may use a method of managing one or more hidden timing parameters, according to another exemplary embodiment.

FIG. 4 is a block diagram illustrating a memory device 400 which may use a method of managing one or more timing parameters, according to another exemplary embodiment.

Referring to FIG. 4, the memory device 400 is different from the memory device 100 of FIG. 1 in that an A bank 110$^I$ includes 4 sub-banks. The A bank 110$^I$ may be divided into first through fourth sub-banks 411, 412, 413, and 414.

The first sub-bank 411 may be connected to a first row decoder 421, a first column decoder 431, a first data line sense amplifier block 441, and first data input/output lines I/O$_{AS1}$. Memory cells of the first sub-bank 411 may be addressed by the first row decoder 421 and the first column decoder 431. Data read from the first sub-bank 411 may be output through the first data line sense amplifier block 441 and the first data input/output lines I/O$_{AS1}$.

The second sub-bank 412 may be connected to a second row decoder 422, a second column decoder 432, a second data line sense amplifier block 442, and a second data line sense amplifier block I/O$_{AS2}$. Memory cells of the second sub-bank 412 may be addressed by the second row decoder 422 and the second column decoder 432. Data read from the second sub-bank 412 may be output through the second data line sense amplifier block 442 and the second data input/output lines I/O$_{AS2}$.

The third sub-bank 413 may be connected to a third row decoder 423, a third column decoder 433, a third data line sense amplifier block 443, and third data input/output lines I/O$_{AS3}$. Memory cells of the third sub-bank 413 may be addressed by the third row decoder 423 and the third column decoder 433. Data read from the third sub-bank 413 may be output through the third data line sense amplifier block 443 and the third data input/output lines I/O$_{AS3}$.

The fourth sub-bank 414 may be connected to a fourth row decoder 424, a fourth column decoder 434, a fourth data line sense amplifier block 444, and fourth data input/output lines I/O$_{AS4}$. Memory cells of the fourth sub-bank 414 may be addressed by the fourth row decoder 424 and the fourth column decoder 434. Data read from the fourth sub-bank 414 may be output through the fourth data line sense amplifier block 444 and the fourth data input/output lines I/O$_{AS4}$.

One of the first through fourth sub-banks 411, 412, 413, and 414 may be selected by two bits from among row address signals RAs applied to the first through fourth row decoders 421 through 424. For example, any one sub-bank of the first through fourth sub-banks 411, 412, 413, and 414 may be selected by an MSB signal RA$_{MSB}$ and an MSB-1 signal RAM$_{SB-1}$ of the row address signals RAs.

Like the A bank 110 of FIG. 4, each of the B bank through the H bank 120 through 180 of FIG. 1 may be divided into four sub-banks, and any one of the first through fourth sub-banks of each of the B bank through the H bank 120 through 180 may be selected by an MSB signal RA$_{MSB}$ and an MSB-1 signal RAM$_{SB-1}$ of row address signals applied to first through fourth row decoders. A first-sub bank of each of the B bank through the H bank 120 through 180 may be connected to a first row decoder, a first column decoder, a first data line sense amplifier block, and first data input/output lines. A second sub-bank of the bank may be connected to a second row decoder, a second column decoder, a second data line sense amplifier block, and second data input/output lines. A third sub-bank of the bank may be connected to a third row decoder, a third column decoder, a third data line sense amplifier block, and third data input/output lines. A fourth sub-bank of the bank may be connected to a fourth row decoder, a fourth column decoder, a fourth data line sense amplifier block, and fourth data input/output lines.

Although the memory device 400 includes 8 banks, that is, the A bank through the H bank 110 through 180, and each of the A bank through the H bank 110 through 180 includes 4 sub-banks in FIG. 4, the present disclosure is not limited thereto and the number of sub-banks included in each of the A bank through the H bank may be different from 4. The sub-banks may be connected to data line sense amplifier blocks and data input/output lines which are independent from each other.

Figure 5:
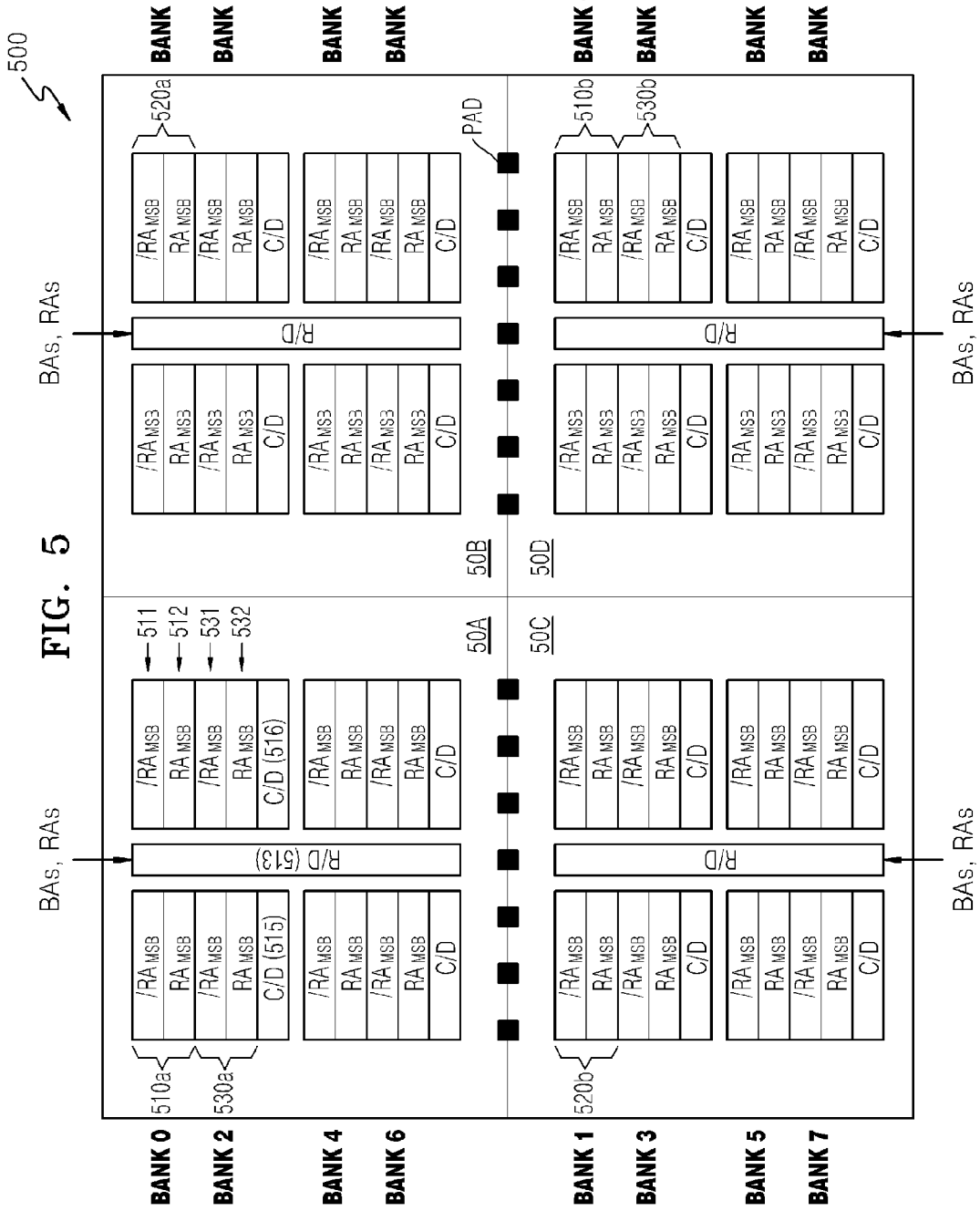
FIG. 5 is a block diagram illustrating a memory device which may use a method of managing one or more hidden timing parameters, according to another exemplary embodiment.

FIG. 5 is a block diagram illustrating a memory device 500 which may use a method of managing one or more timing parameters, according to another embodiment.

Referring to FIG. 5, the memory device 500 includes a plurality of banks, such as first through eighth banks BANK0 through BANK7, each having a stack bank architecture. The first through eighth banks BANK0 through BANK7 may be separated for noise distribution. The first through eighth banks BANK0 through BANK7 may be separately disposed on four equal surfaces, namely, first, second, third, and fourth quarter surfaces, 50A, 50B, 50C, and 50D about pads which are arranged at a center of the memory device 500.

The first bank BANK0 may be disposed on the first quarter surface 50A and the fourth quarter surface 50D, and the second bank BANK1 may be disposed on the second quarter surface 50B and the third quarter surface 50C. The even banks BANK2, BANK4, and BANK6 may be disposed on the first quarter surface 50A and the fourth quarter surface 50D. The odd banks BANK3, BANK5, and BANK7 may be disposed on the second quarter surface 50B and the third quarter surface 50C.

The first bank BANK0 may include a first memory cell array block 510a disposed on the first quarter surface 50A and a memory cell array block 510b disposed on the fourth quarter surface 50D. The second bank BANK1 may include a first memory cell array block 520a disposed on the second quarter surface 50B and a memory cell array block 520b disposed on the third quarter surface 50C. The third bank BANK2 may include a first memory cell array block 530a disposed on the first quarter surface 50A and a memory cell array block 530b disposed on the fourth quarter surface 50D.

Each of the even banks BANK4 and BANK6 may include a first memory cell array block disposed on the first quarter surface 50A and a second memory cell array block disposed on the fourth quarter surface 50D. Each of the odd banks BANK3, BANK5, and BANK7 may include a first memory cell array block disposed on the second quarter surface 50B and a second memory cell array block disposed on the third quarter surface 50C.

The first quarter surface 50A of the memory device 500 has a stack bank structure in which the first memory cell array block 510a of the first bank BANK0 and the first memory cell array block 530a of the third bank BANK2 are stacked. The first memory cell array block 510a of the first bank BANK0 may be divided into two sub-array groups 511 and 512. The first memory cell array block 530a of the third bank BANK2 may be divided into two sub-array groups 531 and 532. The sub-array groups 511 and 512 of the first bank BANK0 and the sub-array groups 531 and 532 of the third bank BANK2 are arranged in a direction, that is, a column direction, in which bit lines of memory cells are arranged.

The first memory cell array blocks 510a and 530a of the first and third banks BANK0 and BANK2 are separated from each other about a row decoder 513. The first memory cell array blocks 510a and 530a may be connected to the row decoder 513 and first and second column decoders 515 and 516. Memory cells of the first memory cell array blocks 510a and 530a may be addressed by the row decoder 513 and the first and second column decoders 515 and 516.

The row decoder 513 may receive bank address signals BAs and row address signals RAs. The first and second column decoders 515 and 516 may receive column address signals (not shown). One bank of the first and third banks BANK0 and BANK2 is selected according to the bank address signals BAs, and memory cells of the sub-array groups 511, 512, 531, and 532 in the selected bank may be addressed according to the row address signals RAs and the column address signals.

The first sub-array group 511 or the second sub-array group 512 of the first bank BANK0 may be selected by any one bit of the row address signals RAs applied to the row decoder 513. For example, the first sub-array group 511 or the second sub-array group 512 may be selected by an MSB signal $RA_{MSB}$ of the row address signals RAs. The first sub-array group 511 may be selected by a $/RA_{MSB}$ signal, and the second sub-array group 512 may be selected by a $RA_{MSB}$ signal.

Like in the first and third banks BANK0 and BANK2, first memory cell array blocks each divided into two sub-array groups are stacked in the fifth and seventh banks BANK4 and BANK6. One of the sub-array groups in the fifth and seventh banks BANK4 and BANK6 may be selected by an MSB signal $RA_{MSB}$ of row address signals applied to the row decoder 513.

In the first through eighth banks BANK0 through BANK7 disposed on the other quarter surfaces, namely, the second, third, and fourth quarter surfaces, 50B, 50C, and 50D, first memory cell array blocks each divided into two sub-array groups are stacked. One of the sub-array groups in the first through eighth banks BANK0 through BANK7 may be selected by an MSB signal $RA_{MSB}$ of row address signals applied to a row decoder disposed on a corresponding one of the quarter surfaces, namely, the second, third, and fourth quarter surfaces, 50B, 50C, and 50D.

Although each of the first through eighth banks BANK0 through BANK7 includes two sub-array groups in FIG. 5, the present disclosure is not limited thereto and the number of sub-array groups included in each of the first through eighth banks BANK0 through BANK7 may be different from 2.

FIG. 6 is a diagram for explaining an exemplary architecture of the first bank BANK0 of FIG. 5.

Referring to FIG. 6, the first sub-array group 511 and a second sub-array group 512 may respectively include a plurality of sub-arrays 611 through 618 and a plurality of sub-arrays 631 through 638. The sub-arrays 611 through 618 in the first sub-array group 511 may be designed to share a data line sense amplifier block (not shown) and data input/output lines (not shown). Likewise, the sub-arrays 631 through 638 in the second sub-array group 512 may be designed to share the data line sense amplifier block and the data input/output lines.

The sub-array 614 in the first sub-array group 511 may be connected to bit line sense amplifier blocks 621 and 622 that are disposed over and under the sub-array 614. The bit line sense amplifier block 621 may be connected to the sub-array 613. The bit line sense amplifier block 621 may be shared by the sub-arrays 613 and 614. The bit line sense amplifier block 622 may be connected to the sub-array 615. The bit line sense amplifier block 622 may be shared by the sub-arrays 614 and 615.

In the sub-array 614 in the first sub-array group 511, when one word line WL1 is enabled, data of memory cells connected to the word line WL1 may be transmitted to the bit line sense amplifier blocks 621 and 622 and may be sensed and amplified. In this case, the sub-array 613 connected to the bit line sense amplifier block 621 and the sub-array 615 connected to the bit line sense amplifier block 622 should be to be inactivated. For example, the sub-arrays 613 and 615 adjacent to the activated sub-array 614 are inactivated. The inactivated sub-arrays 613 and 615 may belong to a keep-away zone.

The first sub-array group 511 may activate a sub-array outside the keep-away zone of the activated sub-array 614, for example, the sub-array 612. When the sub-array 612 is activated, since the sub-arrays 611 and 613 adjacent to the sub-array 612 belong to a keep-away zone, the sub-arrays 611 and 613 are inactivated.

Meanwhile, the sub-array 618 in the first sub-array group 511 may be activated. The sub-array 618 of the first sub-array group 511 is disposed adjacent to the second sub-array group 512. When the sub-array 618 of the first sub-array group 511 is activated, since the sub-array 617 of the first sub-array group 511 and the sub-array 631 of the second sub-array group 512 belong to a keep-away zone, the sub-array 617 and the sub-array 631 are inactivated.

Defective cells may be generated in the sub-arrays 611 through 618 in the first sub-array group 511. The sub-arrays 611 through 618 may include redundancy cells for repairing defective cells. A defective cell generated in any of the sub-arrays 611 through 618 may be replaced with a redundancy cell in the sub-array. Alternatively, in one embodiment, a defective cell generated in any of the sub-arrays 611 through 618 may be replaced with a redundancy cell in another sub-array. The another sub-array may be included in the first sub-array group 511. As such, the first sub-array group 511 may be set to have repair flexibility therein.

The second sub-array group 512 may be set to have repair flexibility therein. The sub-arrays 631 through 638 in the second sub-array group 512 may include redundancy cells for repairing defective cells. A defective cell generated in each of the sub-arrays 631 through 638 in the second sub-array group 512 may be replaced with a redundancy cell of the sub-array. Alternatively, a defective cell generated in each of the sub-arrays 631 through 638 in the second sub-array group 512 may be replaced with a redundancy cell of another sub-array.

A size of each of the first and second sub-array groups 511 and 512 may be reduced by reducing the number of the sub-arrays 611 through 618 or the sub-arrays 631 through 638. Accordingly, as the number of sub-array groups increases, parallelism efficiency may increase. Meanwhile, as the number of sub-arrays in a sub-array group decreases, repair flexibility may decrease. It is found that there is trade-off between a measure (granularity) of a size of a sub-array group and repair flexibility.

Information about a size of a sub-array group may be stored in a storage unit (not shown) in the memory device 500. The storage unit may include a non-volatile element including a fuse or an anti-fuse. A size of a sub-array group may be set to be large enough to include all sub-arrays. Also, a size of a sub-array group may be determined according to the purpose of use.

In order to simultaneously enable a plurality of word lines, the first and second sub-array groups 511 and 512 may be connected to row decoders or latch-type word line drivers whose number is the same as the number of the simultaneously enabled word lines. When a plurality of row decoders are included, since they take up a lot of space on a chip, latch-type word line drivers may be used.

Each of the first and second sub-array groups 511 and 512 may include a plurality of sub-arrays, and the sub-arrays may be designed to share a data line sense amplifier block (not shown) and data input/output lines (not shown). An operation command may be continuously applied to different sub-arrays. Since sub-arrays share data input/output lines, there may exist timing constraints in commands applied to different sub-arrays.

FIG. 7 is a diagram for explaining exemplary timing constraints in continuous commands of different sub-arrays in FIG. 6.

Referring to FIG. 7, one sub-array from among the plurality of sub-arrays 611 through 618 in the first sub-array group 511 is referred to as a sub-array A, and another sub-array is referred as a sub-array B. Upon examining a timing between a current command of the sub-array A and a next command of the sub-array B, there is no timing constraint between an active command ACT of the sub-array A and an active command ACT of the sub-array B. This is because since the active command ACT is a row command, there occurs no collision in data input/output lines shared by the sub-array A and the sub-array B.

There is no timing constraint between the active command ACT of the sub-array A and a precharge command PRE of the sub-array B. Also, there is no timing constraint between the active command ACT and a refresh command REF of the sub-array B. This is because since, like the active command ACT, the precharge command PRE and the refresh command REF are row commands, there occurs no collision in data input/output lines.

A write/read command WR/RD of the sub-array B after the active command ACT of the sub-array A is invalid. This is because since during a write or read command, a column selection line is turned on and a path to data input/output lines is formed by the column selection line, two word lines in different sub-arrays in a sub-array group sharing the data input/output lines may not be simultaneously enabled. In order to apply the write/read command WR/RD in the sub-array B, an active command has already been given, and thus a write/read operation is performed in a state where two word lines are simultaneously enabled.

There is no timing constraint between a precharge command PRE of the sub-array A and the active command ACT, the precharge command PRE, or the refresh command REF of the sub-array B.

In one embodiment, a tPRE2WR interval is needed between the precharge command of the sub-array A and the write command WR of the sub-array B. A tPRE2RD interval is needed between the precharge command PRE of the sub-array A and the read command RD of the sub-array B. When one word line is turned off by the precharge command PRE in the sub-array A, one word line for a write or read operation in the sub-array B may be enabled. A precharge-to-write time tPRE2WR and a precharge-to-read time tPRE2RD may be times taken for a word line of the sub-array A to be turned off.

There is no timing constraint between a refresh command REF of the sub-array A and the active command ACT, the precharge command PRE, or the refresh command REF of the sub-array B.

In one embodiment, a tREF2WR interval is needed between the refresh command REF of the sub-array A and the write command WR of the sub-array B. A tREF2RD interval is needed between the refresh command REF of the sub-array A and the read command RD of the sub-array B. While one word line is refreshed by the refresh command REF of the sub-array A, if another word line is activated by the write/read command WR/RD of the sub-array B, when one word line is turned off after the refresh, one word line for a write or read operation in the sub-array B may be enabled. A refresh-to-write time tREF2WR and a refresh-to-read time tREF2RD may be times taken for a word line of the sub-array A to be turned off.

In one embodiment, a tWR2ACT interval is needed between a write command WR of the sub-array A and the active command ACT of the sub-array B. A tRD2ACT interval is needed between a read command RD of the sub-array A and the active command ACT of the sub-array B. When data is written to a memory cell or read-out data is latched to a data line sense amplifier due to the write/read command WR/RD of the sub-array A, if a column selection line is turned off, an active operation of the sub-array B may be performed. A write-to-active time tWR2ACT and a read-to-active time tRD2ACT may be times taken for the column selection line of the sub-array A to be turned off.

After the write/read command WR/RD of the sub-array A, the precharge command PRE or the write/read command WR/RD of the sub-array B is invalid. This is because two word lines in different sub-arrays in a sub-array group sharing data input/output lines may not be simultaneously enabled.

In one embodiment, a tWR2REF interval is needed between the write command WR of the sub-array A and the refresh command REF of the sub-array B. A tRD2REF interval is needed between the read command of the sub-array A and the refresh command REF of the sub-array B. When a column selection line is turned off by the write/read command WR/RD of the sub-array A, a refresh operation of the sub-array B may be performed. The write-to-refresh time tWR2REF and read-to-refresh time tRD2REF may be times taken for the column selection line of the sub-array A to be turned off.

Figure 8:
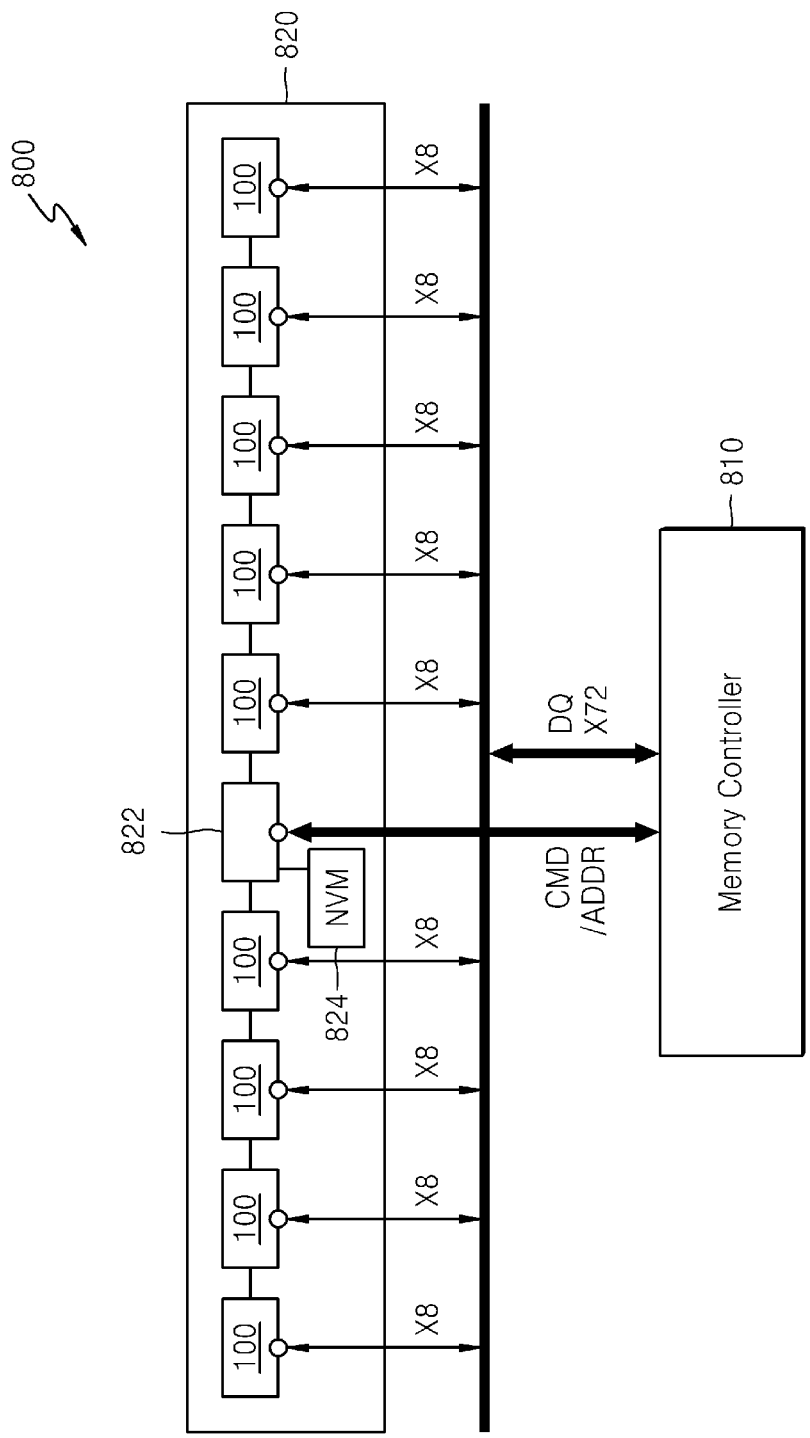
FIG. 8 is a block diagram illustrating a memory system which may use a method of managing one or more hidden timing parameters, according to one exemplary embodiment.

FIG. 8 is a block diagram illustrating an exemplary memory system 800 which may use a method of managing one or more timing parameters, according to one embodiment.

Referring to FIG. 8, the memory system 800 includes a memory controller 810 and a memory module 820. The memory controller 810 may apply command signals CMD, address signals ADDR, and data DQ to the memory module 820. The memory module 820 may include a plurality of the memory devices 100 and a buffer chip 822. The memory module 820 may further include a non-volatile memory device 824.

For example, 9 memory devices 100 may be included in the memory module 820. One of the 9 memory devices 100 may be used to correct an error generated in the 8 memory devices 100. That is, in order to correct a 1-bit error generated in each of the 8 memory devices 100, an 8-bit parity bit is used. To this end, one memory device 100 may be used. Accordingly, X72 data DQ which are a sum of X8 data DQ input and output to and from the memory devices 100 may be transmitted between the memory controller 810 and the memory module 820.

Each of the memory devices 100 may be a memory device that operates in the sub-bank interleaving method described with reference to FIGS. 1 and 4. The memory device 100 may include a plurality of banks each including two or more sub-banks. Sub-banks in any one of the plurality of banks of the memory device 100 may continuously operate in an interleaved manner one sub-bank-by-one sub-bank.

In the memory device 100, a continuous data write operation in one bank may decrease to a row active-to-row active time tRRD between different banks. Accordingly, a memory cell data write time tWR', a /RAS-to-/CAS time tRCD' between the applying of a /RAS signal and the applying of a /CAS signal, or a bit line precharge time tRP' increases during a data write operation in one bank. The /RAS-to-/CAS time tRCD', the memory cell data write time tWR', and the bit line precharge time tRP' are not used to control the timing of a continuous data write operation of sub-banks. In a continuous data write operation time, a host, for example, the memory controller, does not need to observe specifications of timing parameters tRCD', tWR', and tRP'. The /RAS-to-/CAS time tRCD', the memory cell data write time tWR', and the bit line precharge time tRP' may be hidden from the memory controller.

Also, the memory device 100 may be the memory device 500 including a plurality of banks in which memory cell array blocks including two or more sub-array groups are stacked, as described above with reference to FIG. 5. A sub-array outside a keep-away zone of an activated sub-array in a sub-array group may be activated. Also, when a sub-array belonging to the keep-away zone belongs to another sub-array group, a sub-array belonging to the another sub-array group may be inactivated. In the memory device 100, defective cells generated in sub-arrays in a sub-array group may be replaced with corresponding sub-arrays in the sub-array group or redundancy cells in another sub-arrays. In the memory device 100, there may exist timing constraints in commands continuously applied to different sub-arrays.

The buffer chip 822 may receive the command signals CMD and the address signals ADDR from the memory controller 810 and transmit the command signals CMD and the address signals ADDR to the memory devices 100. If an interface speed with the memory controller 810 is very high, performance degradation caused by a difference in speed may be minimized due to the buffer chip 822.

Also, the buffer chip 822 may control an operation of the memory device 100 to be selectively relaxed. The buffer chip 822 monitors whether the command signal CMD and the address signal ADDR access sub-banks in one bank of the memory device 100.

The buffer chip 822 may monitor an MSB signal $RA_{MSB}$ of row address signals which selects sub-banks of the memory device 100. If the sub-banks are accessed, the buffer chip 822 may relax an operation of the memory device 100 such that a memory cell data write time tWR', a /RAS-to-/CAS time tRCD' that is a time between the applying of a /RAS signal and the applying of a /CAS signal, or a bit line precharge time tRP' increases during a data write operation in one bank.

The nonvolatile memory device 824 may store information about a size of a sub-array group of the memory device 500 (see FIG. 5), that is, the number of sub-arrays included in the sub-array group. The nonvolatile memory device 824 may include, for example, a fuse, an anti-fuse, a programmable read-only memory (PROM), or a flash memory. The information about the size of the sub-array group stored in the nonvolatile memory device 824 may be transmitted to the memory controller 810 during power-up.

The memory controller 810 may calculate row address bits for dividing sub-array groups and a row address which is a boundary between sub-arrays by using sub-array group information of the memory device 100. Accordingly, the memory controller 810 may activate a sub-array outside a keep-away zone of an activated sub-array in a sub-array group of the memory device 100. Also, when a sub-array belonging to the keep-away zone belongs to another sub-array group, the sub-array may be inactivated. The memory controller 810 may replace defective cells generated in sub-arrays in a sub-array group of the memory device 100 with corresponding sub-arrays in the sub-array group or redundancy cells of another sub-array. The memory controller 810 may observe timing constraints in commands continuously applied to different sub-arrays.

Figure 9:
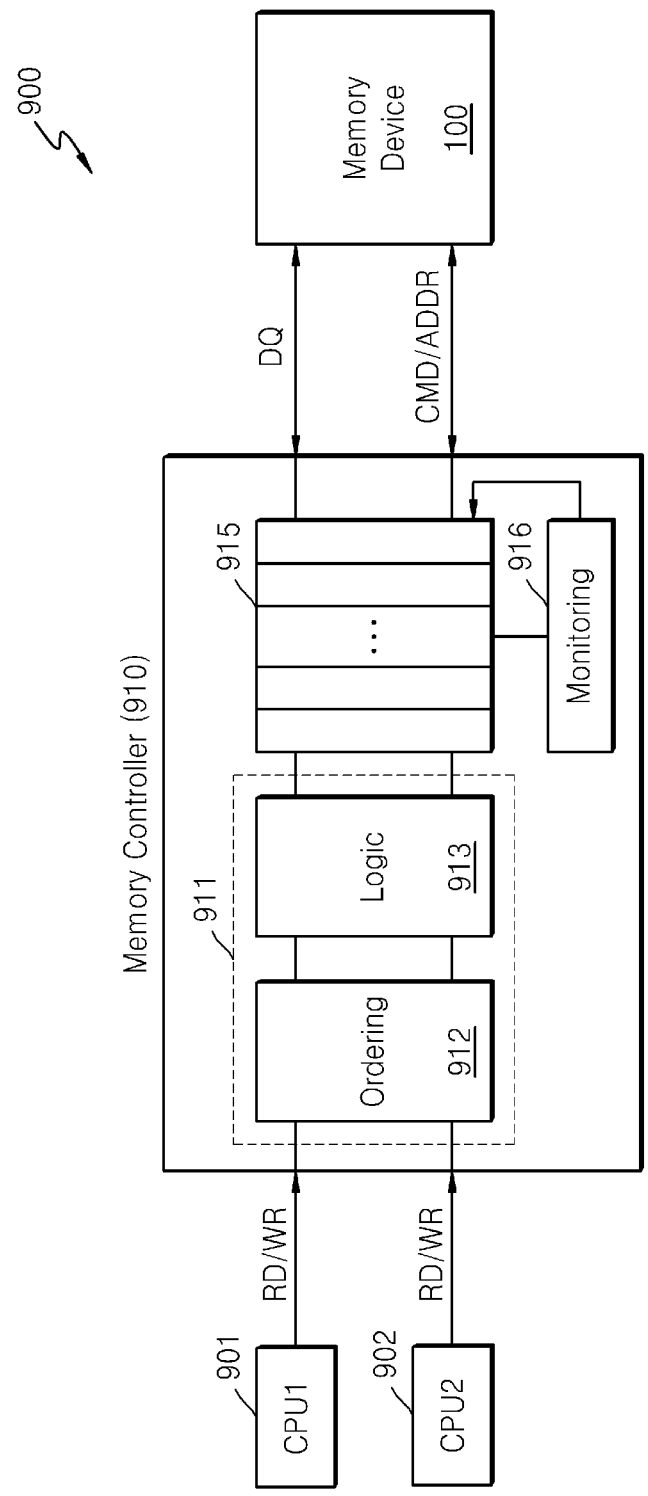
FIG. 9 is a block diagram illustrating a memory system which may use a method of managing one or more hidden timing parameters, according to another exemplary embodiment.

FIG. 9 is a block diagram illustrating an exemplary memory system 900 which may use a method of managing one or more hidden timing parameters, according to one embodiment.

Referring to FIG. 9, the memory system 900 includes a plurality of hosts 901 and 902, a memory controller 910, and the memory device 100. Each of the hosts 901 and 902 may include a microprocessor. The memory controller 910 may control the memory device 100 according to read/write commands RD/WR requested by the hosts 901 and 902. The memory controller 910 may generate a command signal CMD and an address signal ADDR based on the read/write commands RD/WR of the hosts 901 and 902 and transmit the command signal CMD and the address signal ADDR to the memory device 100. Also, the memory device 100 may transmit or receive data DQ to or from the memory controller 910 according to the read or write commands RD/WR of the hosts 901 and 902.

The memory device 100 may be a memory device that operates in the sub-bank interleaving method described with reference to FIGS. 1 and 4. The memory device 100 may include a plurality of banks each including two or more sub-banks. In the memory device 100, sub-banks in any one bank from among the plurality of banks may continuously operate in an interleaved manner one sub-bank-by-one sub-bank.

In the memory device 100, a continuous data write operation in one bank may decrease to a row active-to-row active time tRRD between different banks. Accordingly, a memory cell data write time tWR' a /RAS-to-/CAS time tRCD' between the applying of a /RAS signal and the applying of a /CAS signal, or a bit line precharge time tRP' increases during a data write operation in one bank. The /RAS-to-/CAS time tRCD', the memory cell data write time tWR', and the bit line precharge time tRP' are not included in a time interval of a continuous data write operation of sub-banks. In a continuous data write operation time, the memory controller 910 does not need to observe specifications of timing parameters tRCD', tWR', and tRP'. The /RAS-to-/CAS time tRCD', the memory cell data write time tWR', and the bit line precharge time tRP' may be hidden from the memory controller 910.

Also, the memory device 100 may be the memory device 500 including a plurality of banks in which memory cell array blocks including two or more sub-array groups are stacked, as described above with reference to FIG. 5. A sub-array outside a keep-away zone of an activated sub-array in a sub-array group may be activated. Also, when a sub-array belonging to the keep-away zone belongs to another sub-array group, a sub-array belonging to the another sub-array group may be inactivated. In the memory device 100, defective cells generated in sub-arrays in a sub-array group may be replaced with corresponding sub-arrays in the sub-array group or redundancy cells in another sub-array. In the memory device 100, there may exist timing constraints in commands continuously applied to different sub-arrays.

The memory controller 910 may vary the command signal CMD and the address signal ADDR of the memory device 100 according to the read/write commands RD/WR requested by the hosts 901 and 902. The memory controller 910 may include a transaction queue 911, a command queue 915, and a monitoring unit 916. The transaction queue 911 may include an ordering unit 912 which gives an order to the read/write commands RD/WR requested by the plurality of hosts 901 and 902, and a logic unit 913 which converts the read/write commands RD/WR of the hosts 901 and 902 into the command signal CMD and the address signal ADDR of the memory device 100. The command queue 915 may sequentially store the command signal CMD and the address signal ADDR generated by the logic unit 913, and then may transmit the command signal CMD and the address signal ADDR to the memory device 100.

The monitoring unit 916 may monitor the command signal CMD and the address signal ADDR stored in the command queue 915, and determine whether the command signal CMD and the address signal ADDR access sub-banks in one bank of the memory device 100. The monitoring unit 916 may monitor an MSB signal $RA_{MSB}$ of row address signals which selects sub-banks of the memory device 100. If the sub-banks are accessed, the monitoring unit 916 may relax an operation of the memory device 100 such that a memory cell data write time tWR', a /RAS-to-/CAS time tRCD' that is a time between the applying of a /RAS signal and the applying of a /CAS signal, or a bit line precharge time tRP' increases.

The memory controller 910 may calculate row address bits for dividing sub-array groups and a row address which is a boundary between sub-arrays by using sub-array group information of the memory device 100. Accordingly, the memory controller 910 may inactivate a sub-array outside a keep-away zone of an activated sub-array in a sub-array group. Also, when a sub-array belonging to the keep-away zone belongs to another sub-array group, the sub-array may be inactivated. The memory controller 910 replaces defective cells generated in sub-arrays in a sub-array group of the memory device 100 with corresponding sub-arrays in the sub-array group or redundancy cells of another sub-array. The memory controller 910 may observe timing constraints in commands continuously applied to different sub-arrays.

Figure 10:
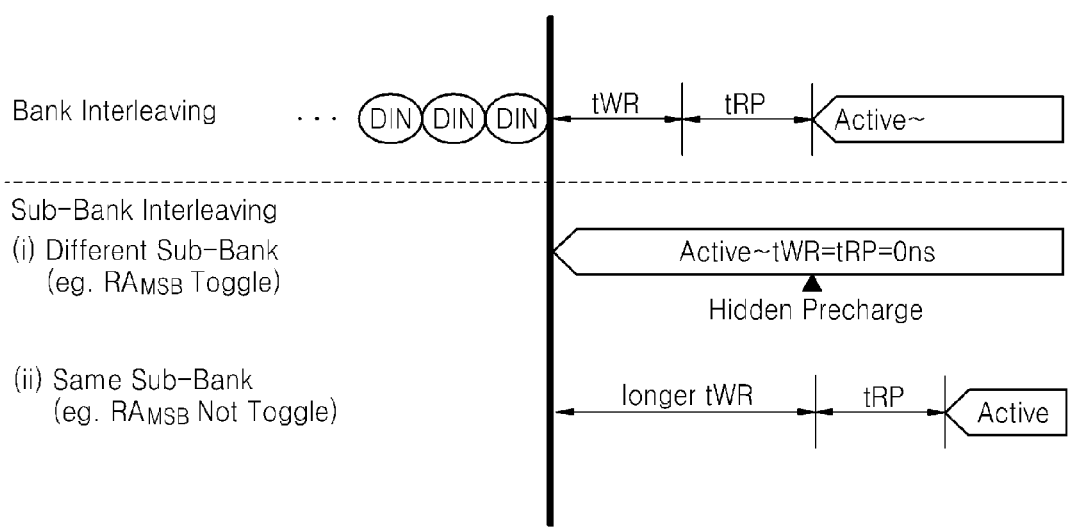
FIG. 10 is a diagram for explaining a specification of a timing parameter between a memory controller and a memory device of FIG. 9, according to certain exemplary embodiments.

The memory controller 910 observes whether the memory device 100 operates according to a specification of a timing parameter in a data write operation, as shown, for example, in FIG. 10. If the memory device 100 operates in the bank interleaving method of FIG. 3A, the memory controller 910 observes, for example, specifications of timing parameters tWR and tRP, from among timing parameters for a data write operation, after predetermined write data DIN is input and before a next active command is input. A write recovery time tWR may be set to be, for example, about 15 ns or more, and a row precharge time tRP may be set to be, for example, about 15 nm or more.

If the memory device 100 operates in the sub-bank interleaving method of FIGS. 3B through 3D and different sub-banks are selected by toggling an MSB signal $RA_{MSB}$ of row address signals, the memory controller 910 does not need to observe specifications of timing parameters tWR and tRP from among timing parameters for a data write operation. In this case, each of a write recovery time tWR and a row precharge time tRP of the memory device 100 specifications of which are observed by the memory controller 910 may be set to be 0 ns. As the row precharge time tRP is set to be 0 ns, a precharge operation of the memory device 100 becomes a hidden precharge operation.

Even when the memory device 100 operates in the sub-bank interleaving method of FIGS. 3B through 3D, an MSB signal $RA_{MSB}$ of row address signals may not be toggled and thus the same sub-banks may be selected. In this case, the memory device 100 performs a continuous same bank access operation similar to that in the bank interleaving method. The memory controller 910 needs to observe specifications of timing parameters tWR and tRP from among timing parameters for a data write operation. In this case, a write recovery time tWR and a row precharge time tRP of the memory device 100 specifications of which are observed by the memory controller 910 may be set to be, for example, 25 ns or more and 15 ns or more, respectively.

Figure 11:
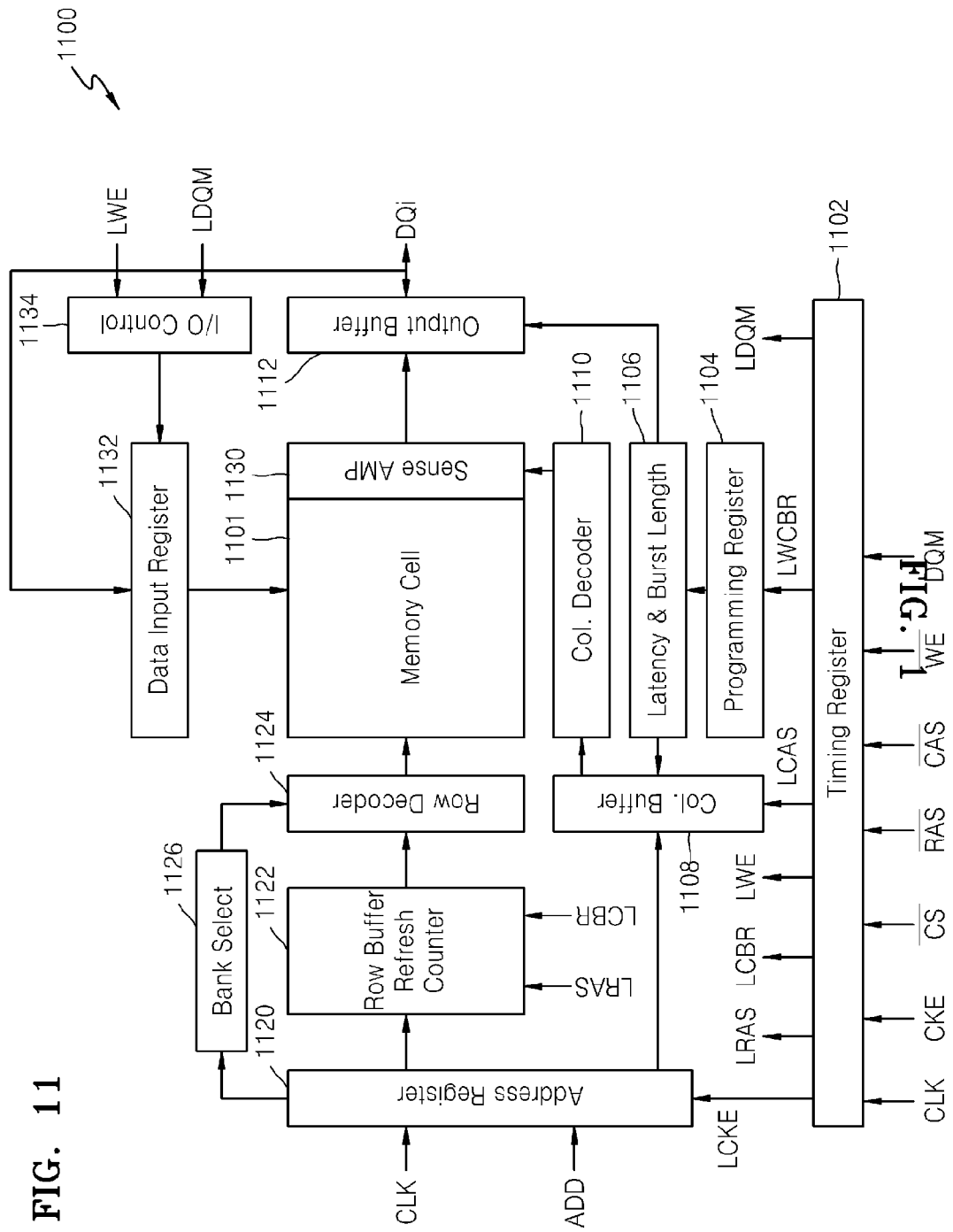
FIG. 11 is a block diagram illustrating a semiconductor memory device which may use a method of managing one or more hidden timing parameters, according to one exemplary embodiment.

A memory device for performing a method of managing one or more hidden timing parameters may be included in a semiconductor memory device as shown in FIG. 11, for example, a double data rate synchronous dynamic random access memory (DDR-SDRAM) 1100.

Referring to FIG. 11, the DDR-SDRAM 1100 may include a memory cell array 1101 including a DRAM cell, and various circuit blocks for driving the DRAM cell. For example, when a chip selection signal CS changes from an inactive level (for example, a logic high level) to an active level (for example, a logic low level), a timing register 1102 may be activated. The timing register 1102 may receive command signals such as a clock signal CLK, a clock enable signal CKE, a chip selection signal CSB, a row address strobe signal RASB, a column address strobe signal CASB, a write enable signal WEB, and a data input/output mask signal DQM from the outside, and generate various internal command signals LRAS, LCBR, LWE, LCAS, LWCBR, and LDQM for controlling the circuit blocks by processing the command signals.

Some of the internal command signals generated by the timing register 1102 are stored in a programming register 1104. For example, latency information or burst length information related to data output may be stored in the programming register 1104. The internal command signals stored in the programming register 1104 may be applied to a latency/burst length control unit 1106. The latency/burst length control unit 1106 may apply a control signal for controlling a latency or a burst length of data output to a column decoder 1110 or an output buffer 1112 through a column address buffer 1108.

An address register 1120 may receive an address signal ADD from the outside. A row address signal may be applied to a row decoder 1124 through a row address buffer 1122. Also, a column address signal may be applied to the column decoder 1110 through a column address buffer 1108. The row address buffer 1122 may further receive a refresh address signal generated in a refresh counter in response to the refresh command signals LRAS and LCBR, and may apply any one of the row address signal and the refresh address signal to the row decoder 1124. Also, the address register 1120 may apply a bank signal for selecting a bank to a bank selecting unit 1126.

The row decoder 1124 may decode the row address signal or the refresh address signal input from the row address buffer 1122, and activate a word line of the memory cell array 1101. The column decoder 1110 may decode the column address signal, and perform a selection operation on a bit line of the memory cell array 1101. For example, a column selection line may be applied to the semiconductor memory device 1100 and a selection operation may be performed through the column selection line.

A sense amplifier 1130 may amplify data of a memory cell selected by the row decoder 1124 and the column decoder 1110 to obtain amplified data, and transmit the amplified data to the output buffer 1112. Data to be written to a data cell may be transmitted to the memory cell array 1101 through a data input register 1132, and an input/output controller 1134 may control a data transmission operation through the data input register 1132.

The memory cell array 1101 may include a plurality of banks each including two or more sub-banks. In the memory cell array 1101, sub-banks in one bank from among the plurality of banks may continuously operate in an interleaved manner one sub-bank-by one sub-bank. A continuous data write operation in one bank may decrease a row active-to-row active time tRRD between different banks. Accordingly, a memory cell data write time tWR' a /RAS-to-/CAS time tRCD' between the applying of a /RAS signal and the applying of a /CAS signal, or a bit line precharge time tRP' increases during a data write operation in one bank. The /RAS-to-/CAS time tRCD', the memory cell data write time tWR', and bit line precharge time tRP' are not included in a time interval of a continuous data write operation of sub-banks. In a continuous data write operation of sub-banks, a memory controller does not need to observe specifications of timing parameters tRCD', tWR', and tRP'. The /RAS-to-/CAS time tRCD', the memory cell data write time tWR', and the bit line precharge time tRP' may be hidden from the memory controller.

Also, the memory cell array 1101 may include a plurality of banks in which memory cell array blocks each including two or more sub-array groups are stacked. In the memory cell array 1101, a sub-array outside a keep-away zone of an activated sub-array in a sub-array group may be activated. Also, when a sub-array belonging to the keep-away zone belongs to another sub-array group, a sub-array belonging to the another sub-array group may be inactivated. In the memory cell array 1101, defective cells generated in sub-arrays in a sub-array group may be replaced with corresponding sub-arrays in the sub-array group or redundancy cells in another sub-array. In the memory cell array 1101, there may exist timing constraints in commands continuously applied to different sub-arrays.

Figure 12:
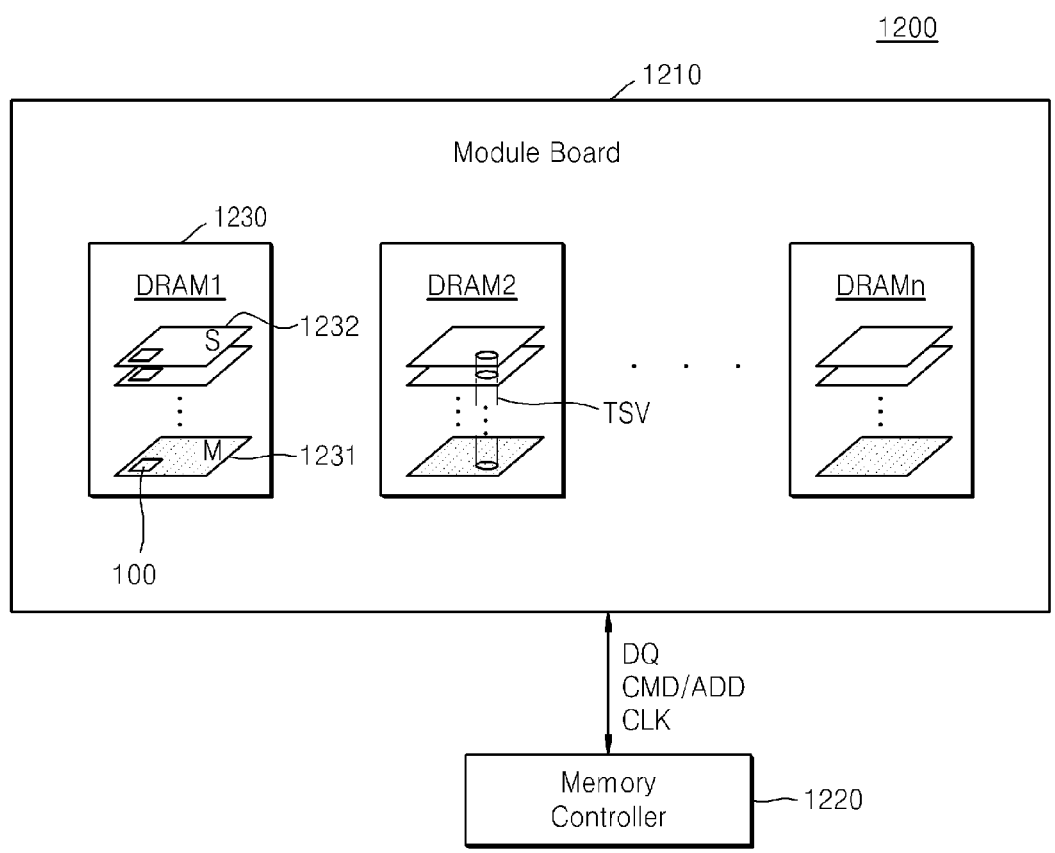
FIG. 12 is a block diagram illustrating a memory system to which the semiconductor memory device of FIG. 11 is applied, according to an exemplary embodiment.

FIG. 12 is a diagram illustrating a memory system 1200 to which the semiconductor memory device 1100 of FIG. 11 is applied, according to one embodiment.

Referring to FIG. 12, the memory system 1200 may include a memory module 1210 and a memory controller 1220. In the memory module 1210, one or more semiconductor memory devices 1230 may be mounted on a module board. The semiconductor memory device 1230 may be embodied as a DRAM chip. In one embodiment, one or more of the semiconductor memory devices 1230 may include a plurality of semiconductor layers. The semiconductor layers may include, for example, one or more master chips 1231 and one or more slave chips 1232. A signal may be transmitted between the semiconductor layers through one or more through-silicon via TSV.

Each of the master chip 1231 and the slave chip 1232 may include the memory device 100 of one of the above embodiments. The memory devices 100 may be a memory device that operates in the sub-bank interleaving method described with reference to FIGS. 1 and 4. The memory device 100 may include a plurality of banks each including two or more sub-banks. In the memory device 100, sub-banks in one bank from among the plurality of banks may continuously operate in an interleaved manner.

In the memory device 100, a continuous data write operation in one bank may decrease to a row active-to-row active time tRRD between different sub-banks. Accordingly, a memory cell data write time tWR', a /RAS-to-/CAS time tRCD' between the applying of a /RAS signal and the applying of a /CAS signal, or a bit line precharge time tRP' may increase during a data write operation in one bank. The /RAS-to-/CAS time tRCD', memory cell data write time tWR', and the bit line precharge time tRP' are not used to control time interval of a continuous data write operation of sub-banks. In a continuous data write operation of sub-banks, a memory controller does not need to observe specifications of timing parameters tRCD', tWR', and tRP'. The /RAS-to-/CAS time tRCD', the memory cell data write time tWR', and the bit line precharge time tRP' may be hidden from the memory controller.

Also, the memory device 100 may be the memory device 500 including a plurality of banks in which memory cell array blocks including two or more sub-array groups are stacked, as described above with reference to FIG. 5. A sub-array outside a keep-away zone of an activated sub-array in a sub-array group may be activated. Also, when a sub-array belonging to the keep-away zone belongs to another sub-array group, a sub-array belonging to the another sub-array group may be inactivated. In the memory device 100, defective cells generated in sub-arrays in a sub-array group may be replaced with corresponding sub-arrays in the sub-array group or redundancy cells in another sub-array. In the memory device 100, there may exist timing constraints in commands continuously applied to different sub-arrays.

The memory module 1210 may communicate with a memory controller 1220 via a system bus. Data DQ, a command/address signal CMD/ADD, and a clock signal CLK may be transmitted or received between the memory module 1210 and the memory controller 1220 via the system bus. Although the controller 1220 is shown as a separate device, in certain embodiments, it may be located as part of the module 1210.

Figure 13:
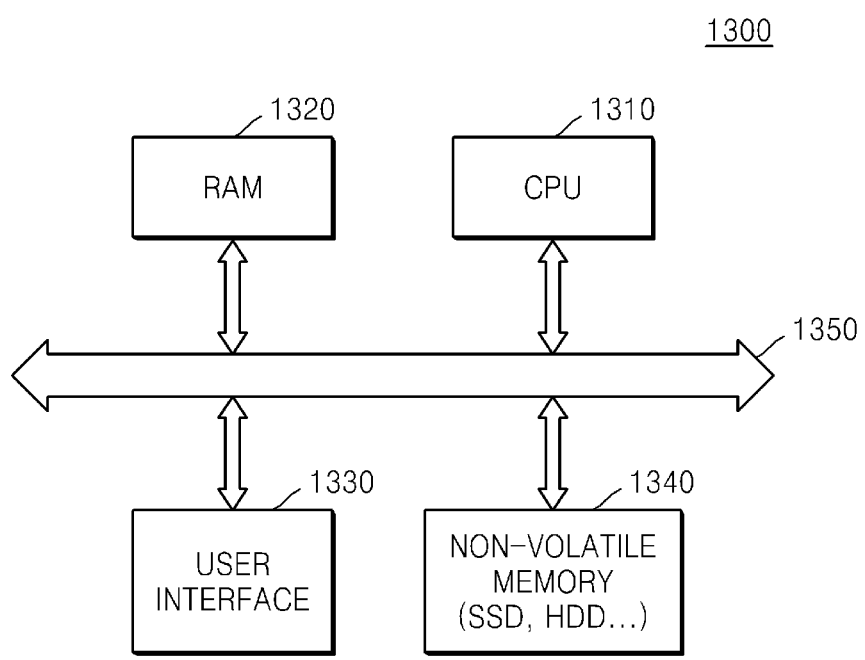
FIG. 13 is a block diagram illustrating a computing system on which a memory system is mounted, according to an exemplary embodiment.

FIG. 13 is a block diagram illustrating a computing system 1300 on which a memory system is mounted, according to an exemplary embodiment.

Referring to FIG. 13, a RAM may be mounted as a semiconductor memory device on the computing system 1300 such as a mobile device or a desktop computer. The RAM 1320 may be any one described in the embodiments of the present disclosure. For example, the RAM 1320 may be a semiconductor memory device or a memory module in the above embodiments. Alternatively, the RAM 1320 may be a combination of a semiconductor memory device and a memory controller.

The computing system 1300 includes a central processing unit (CPU) 1310, the RAM 1320, a user interface 1330, and a nonvolatile memory 1340, which are electrically connected to a bus 1350. The nonvolatile memory 1340 may be a mass storage device such as a solid state drive (SSD) or a hard disk drive (HDD).

In the computing system 1300, the RAM 1320 may include the memory device 100. The memory device 100 may be a memory device that operates in the sub-bank interleaving method described with reference to FIGS. 1 and 4. The memory device 100 may include a plurality of banks each including two or more sub-banks. In the memory device 100, sub-banks in one bank from among the plurality of banks may continuously operate in an interleaved manner one sub-bank-by-one sub-bank.

In the memory device 100, a continuous data write operation in one bank may decrease to a row active-to-row active time tRRD between different banks. Accordingly, a memory cell data write time tWR', a /RAS-to-/CAS time tRCD' between the applying of a /RAS signal and the applying of a /CAS signal, or a bit line precharge time tRP' increases during a data write operation in one bank. The /RAS-to-/CAS time tRCD', the memory cell data write time tWR', and the bit line precharge time tRP' are not used to control a time interval of a continuous data write operation of sub-banks. In a continuous data write operation of sub-banks, a memory controller does not need to observe specifications of timing parameters tRCD', tWR', and tRP'. The /RAS-to-/CAS time tRCD', the memory cell data write time tWR', and the bit line precharge time tRP' may be hidden from the memory controller.

Also, the memory device 100 may be the memory device 500 including a plurality of banks in which memory cell array blocks including two or more sub-array groups are stacked, as described above with reference to FIG. 5. A sub-array outside a keep-away zone of an activated sub-array in a sub-array group may be activated. Also, when a sub-array belonging to the keep-away zone belongs to another sub-array group, a sub-array belonging to the another sub-array group may be inactivated. In the memory device 100, defective cells generated in sub-arrays in a sub-array group may be replaced with corresponding sub-arrays in the sub-array group or redundancy cells in another sub-array. In the memory device 100, there may exist timing constraints in commands continuously applied to different sub-arrays.

While the present disclosure has been particularly shown and described with reference to exemplary embodiments thereof, it will be understood that various changes in form and details may be made therein without departing from the spirit and scope of the following claims.

What is claimed is:

1. A method of performing write operations in a memory device including a plurality of banks in which a plurality of memory cells are arranged, each bank including two or more sub-banks including at least a first sub-bank and a second sub-bank, the method comprising:
performing a first row cycle for writing to a first word line of the first sub-bank, the first row cycle including a plurality of first sub-periods, each sub-period for performing a particular action; and
performing a second row cycle for writing to a first word line of the second sub-bank, the second row cycle including a plurality of second sub-periods of the same type as the plurality of first sub-periods;
wherein the first row cycle overlaps with the second row cycle, and a first type sub-period of the first sub-periods overlaps with a second type sub-period of the second sub-periods, the first type and second type being different types.

2. The method of claim 1, wherein the first type sub-period of the first sub-periods also overlaps with a first type sub-period of the second sub-periods, the first types being the same type.

3. The method of claim 2, wherein the first type sub-period is a data write operation time period, and the second type sub-period is a word line enable time period or a precharge time period.

4. The method of claim 2, wherein the first type sub-period is a word line enable time period, and the second type sub-period is a precharge time period.

5. The method of claim 2, wherein the first type sub-period is a precharge time period, and the second type sub-period is a word line enable time period.

6. The method of claim 1, wherein the first type sub-period is a word line enable time period, and the second type sub-period is a precharge time period.

7. The method of claim 1, wherein a row cycle start time for the first row cycle is a different time from a row cycle start time for the second row cycle.

8. The method of claim 7, wherein a row cycle end time for the first row cycle is a different time from a row cycle end time for the second row cycle, and the time between the row cycle start time and row cycle end time for the first row cycle is the same as the time between the row cycle start time and row cycle end time for the second row cycle.

9. The method of claim 7, wherein a difference between the row cycle start time for the first row cycle and the row cycle start time for the second row cycle is between 5% and 25% of the difference between the row cycle start time for the first row cycle and the row cycle end time for the first row cycle.

10. The method of claim 1, further comprising a plurality of additional row cycles for writing to the first sub-bank and a plurality of additional row cycles for writing to the second sub-bank, wherein starts of the row cycles between the first sub-bank and second sub-bank are staggered.

11. A method of performing write operations in a memory device including a plurality of banks in which a plurality of memory cells are arranged, each bank including two or more sub-banks including at least a first sub-bank and a second sub-bank, the method comprising:
performing a first cycle for a first word line of a first sub-bank of a memory bank for writing to the first word line of the first sub-bank, the first cycle including a word line enable time period, a data write operation time period, and a precharge time period; and
performing a second cycle for a first word line of a second sub-bank of the memory bank for writing to the first word line of the second sub-bank, the second cycle including a word line enable time period, a data write operation time period, and a precharge time period;
wherein the first cycle overlaps with the second cycle, and the data write operation time period of the first cycle overlaps with at least one of the word line enable time period and the precharge time period of the second cycle.

12. The method of claim 11, wherein the data write operation time period of the first cycle also overlaps with the data write operation time period of the second cycle.

13. The method of claim 12, wherein the word line enable time period of the first cycle overlaps with the precharge time period of the second cycle.

14. The method of claim 12, wherein the precharge time period of the first cycle overlaps with the precharge time period of the second cycle.

15. The method of claim 12, wherein the word line enable time period of the first cycle overlaps with the word line enable time period of the second cycle.

16. A controller for controlling write operations in a memory device including a plurality of banks in which a plurality of memory cells are arranged, each bank including two or more sub-banks including at least a first sub-bank and a second sub-bank, the controller configured to implement a method comprising:

performing a first row cycle for writing to a first word line of the first sub-bank, the first row cycle including a plurality of first sub-periods, each sub-period for performing a particular action; and performing a second row cycle for writing to a first word line of the second sub-bank, the second row cycle including a plurality of second sub-periods of the same type as the plurality of first sub-periods;

wherein the first row cycle overlaps with the second row cycle, and a first type sub-period of the first sub-periods overlaps with a second type sub-period of the second sub-periods, the first type and second type being different types.

17. The controller of claim 16, wherein first type sub-period of the first sub-periods also overlaps with a first type sub-period of the second sub-periods, the first types being the same type.

18. The controller of claim 17, wherein the first type sub-period is a data write operation time period, and the second type sub-period is a word line enable time period or a precharge time period.

19. The controller of claim 16, wherein a row cycle start time for the first row cycle is a different time from a row cycle start time for the second row cycle.

20. The controller of claim 19, wherein a row cycle end time for the first row cycle is a different time from a row cycle end time for the second row cycle, and the time between the row cycle start time and row cycle end time for the first row cycle is the same as the time between the row cycle start time and row cycle end time for the second row cycle.

* * * * *